(12) United States Patent
Hornung

(10) Patent No.: US 11,704,130 B2
(45) Date of Patent: Jul. 18, 2023

(54) INDEXING EXTERNAL MEMORY IN A RECONFIGURABLE COMPUTE FABRIC

(71) Applicant: Micron Technology, Inc., Boise, ID (US)

(72) Inventor: Bryan Hornung, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/402,828

(22) Filed: Aug. 16, 2021

(65) Prior Publication Data

US 2023/0053062 A1     Feb. 16, 2023

(51) Int. Cl.
*G06F 9/30* (2018.01)
*G06F 9/355* (2018.01)

(52) U.S. Cl.
CPC ........ *G06F 9/30065* (2013.01); *G06F 9/3004* (2013.01); *G06F 9/30018* (2013.01); *G06F 9/355* (2013.01)

(58) Field of Classification Search
CPC .............................. G06F 9/3004; G06F 9/355
See application file for complete search history.

(56) References Cited

U.S. PATENT DOCUMENTS

| 8,122,229 | B2 | 2/2012 | Wallach et al. |
| 8,156,307 | B2 | 4/2012 | Wallach et al. |
| 8,205,066 | B2 | 6/2012 | Brewer et al. |
| 8,423,745 | B1 | 4/2013 | Brewer |
| 8,561,037 | B2 | 10/2013 | Brewer et al. |
| 9,710,384 | B2 | 7/2017 | Wallach et al. |
| 10,990,391 | B2 | 4/2021 | Brewer |
| 10,990,392 | B2 | 4/2021 | Brewer |
| 2006/0031652 | A1* | 2/2006 | Richter ................... G06F 8/445 711/165 |
| 2008/0270708 | A1 | 10/2008 | Warner et al. |
| 2012/0079177 | A1 | 3/2012 | Brewer et al. |
| 2013/0332711 | A1 | 12/2013 | Leidel et al. |
| 2015/0143350 | A1 | 5/2015 | Brewer |
| 2015/0206561 | A1 | 7/2015 | Brewer et al. |
| 2017/0103312 | A1* | 4/2017 | Henry ..................... G06N 3/063 |
| 2019/0042214 | A1 | 2/2019 | Brewer |

(Continued)

FOREIGN PATENT DOCUMENTS

| WO | 2010051167 | 5/2010 |
| WO | 2013184380 | 12/2013 |

(Continued)

*Primary Examiner* — Jacob Petranek
(74) *Attorney, Agent, or Firm* — Schwegman Lundberg & Woessner, P.A.

(57) ABSTRACT

Various examples are directed to systems and methods in which a flow controller of a first synchronous flow may receive an instruction to execute a first loop using the first synchronous flow. The flow controller may determine a first iteration index for a first iteration of the first loop. The flow controller may send, to a first compute element of the first synchronous flow, a first synchronous message to initiate a first synchronous flow thread for executing the first iteration of the first loop. The first synchronous message may comprise the iteration index. The first compute element may execute an input/output operation at a first location of a first compute element memory indicated by the first iteration index.

20 Claims, 19 Drawing Sheets

(56) References Cited

U.S. PATENT DOCUMENTS

| | | |
|---|---|---|
| 2019/0171604 A1 | 6/2019 | Brewer |
| 2019/0243700 A1 | 8/2019 | Brewer |
| 2019/0303154 A1 | 10/2019 | Brewer |
| 2019/0324928 A1 | 10/2019 | Brewer |
| 2019/0340019 A1 | 11/2019 | Brewer |
| 2019/0340020 A1 | 11/2019 | Brewer |
| 2019/0340023 A1 | 11/2019 | Brewer |
| 2019/0340024 A1 | 11/2019 | Brewer |
| 2019/0340027 A1 | 11/2019 | Brewer |
| 2019/0340035 A1 | 11/2019 | Brewer |
| 2019/0340154 A1 | 11/2019 | Brewer |
| 2019/0340155 A1 | 11/2019 | Brewer |
| 2021/0055964 A1 | 2/2021 | Brewer |
| 2021/0064374 A1 | 3/2021 | Brewer |
| 2021/0064435 A1 | 3/2021 | Brewer |
| 2021/0149600 A1 | 5/2021 | Brewer |
| 2021/0157591 A1* | 5/2021 | Zbiciak ............... G06F 9/30036 |
| 2021/0255976 A1* | 8/2021 | Gottscho ................. G06F 13/28 |
| 2021/0373801 A1* | 12/2021 | Vines .................. G06F 13/1673 |

FOREIGN PATENT DOCUMENTS

| | | |
|---|---|---|
| WO | 2019191740 | 10/2019 |
| WO | 2019191742 | 10/2019 |
| WO | 2019191744 | 10/2019 |
| WO | 2019217287 | 11/2019 |
| WO | 2019217295 | 11/2019 |
| WO | 2019217324 | 11/2019 |
| WO | 2019217326 | 11/2019 |
| WO | 2019217329 | 11/2019 |
| WO | 2019089816 | 4/2020 |

* cited by examiner

INDEXING EXTERNAL MEMORY IN A RECONFIGURABLE COMPUTE FABRIC

BACKGROUND

Various computer architectures, such as the Von Neumann architecture, conventionally use a shared memory for data, a bus for accessing the shared memory, an arithmetic unit, and a program control unit. However, moving data between processors and memory can require significant time and energy, which in turn can constrain performance and capacity of computer systems. In view of these limitations, new computing architectures and devices are desired to advance computing performance beyond the practice of transistor scaling (i.e., Moore's Law).

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
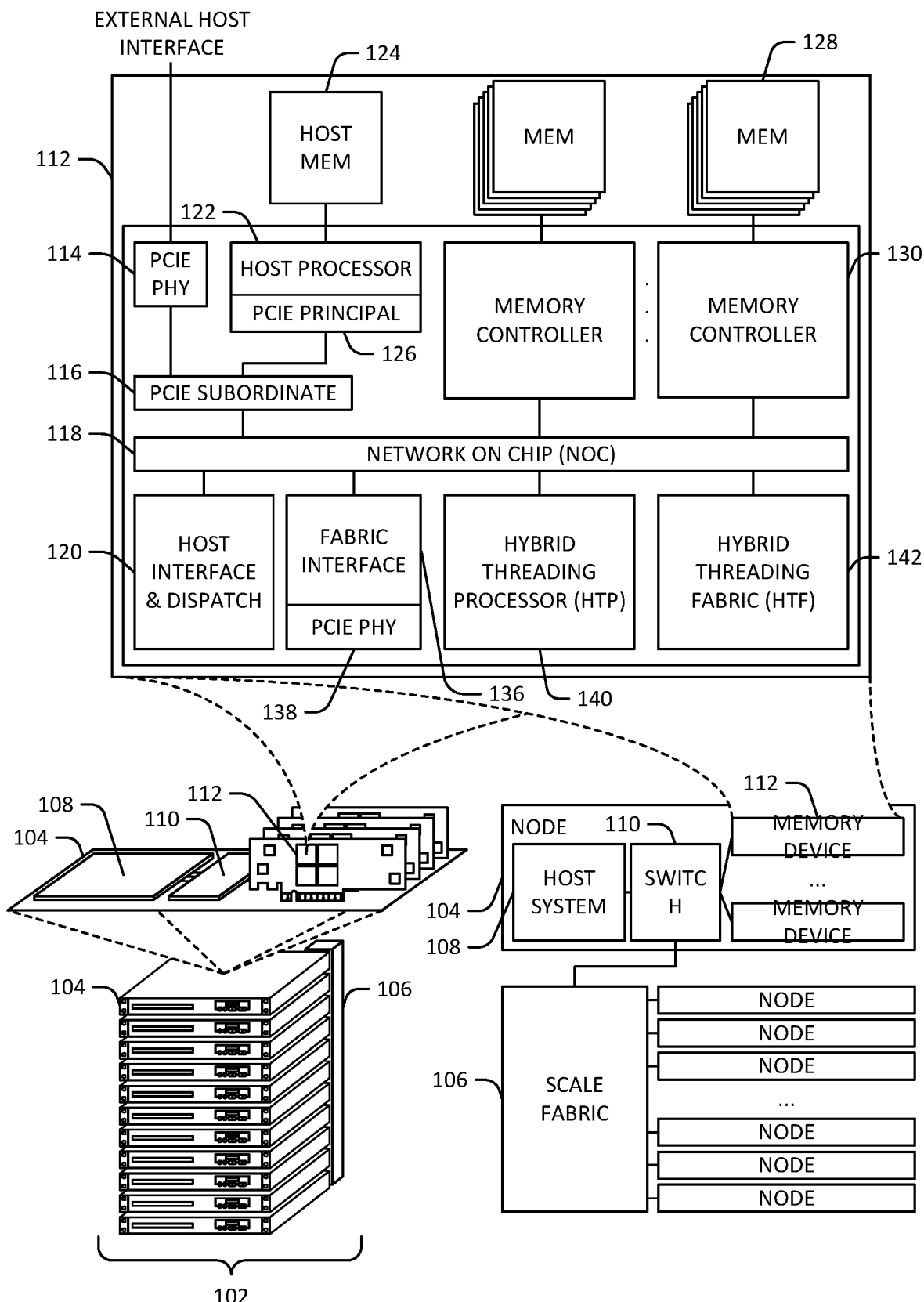
FIG. 1 illustrates generally a first example of a first memory-compute device in the context of a memory-compute system, according to an embodiment.

Recent advances in materials, devices, and integration technology, can be leveraged to provide memory-centric compute topologies. Such topologies can realize advances in compute efficiency and workload throughput, for example, for applications constrained by size, weight, or power requirements. The topologies can be used to facilitate low-latency compute near, or inside of, memory or other data storage elements. The approaches can be particularly well-suited for various compute-intensive operations with sparse lookups, such as in transform computations (e.g., fast Fourier transform computations (FFT)), or in applications such as neural networks or artificial intelligence (AI), financial analytics, or simulations or modeling such as for computational fluid dynamics (CFD), Enhanced Acoustic Simulator for Engineers (EASE), Simulation Program with Integrated Circuit Emphasis (SPICE), and others.

Systems, devices, and methods discussed herein can include or use memory-compute systems with processors, or processing capabilities, that are provided in, near, or integrated with memory or data storage components. Such systems are referred to generally herein as compute-near-memory (CNM) systems. A CNM system can be a node-based system with individual nodes in the systems coupled using a system scale fabric. Each node can include or use specialized or general purpose processors, and user-accessible accelerators, with a custom compute fabric to facilitate intensive operations, particularly in environments where high cache miss rates are expected.

In an example, each node in a CNM system can have a host processor or processors. Within each node, a dedicated hybrid threading processor can occupy a discrete endpoint of an on-chip network. The hybrid threading processor can have access to some or all of the memory in a particular node of the system, or a hybrid threading processor can have access to memories across a network of multiple nodes via the system scale fabric. The custom compute fabric, or hybrid threading fabric, at each node can have its own processor(s) or accelerator(s) and can operate at higher bandwidth than the hybrid threading processor. Different nodes in a compute-near-memory system can be differently configured, such as having different compute capabilities, different types of memories, different interfaces, or other differences. However, the nodes can be commonly coupled to share data and compute resources within a defined address space.

In an example, a compute-near-memory system, or a node within the system, can be user-configured for custom operations. A user can provide instructions using a high-level programming language, such as C/C++, that can be compiled and mapped directly into a dataflow architecture of the system, or of one or more nodes in the CNM system. That is, the nodes in the system can include hardware blocks (e.g., memory controllers, atomic units, other customer accelerators, etc.) that can be configured to directly implement or support user instructions to thereby enhance system performance and reduce latency.

In an example, a compute-near-memory system can be particularly suited for implementing a hierarchy of instructions and nested loops (e.g., two, three, or more, loops deep, or multiple-dimensional loops). A standard compiler can be used to accept high-level language instructions and, in turn, compile directly into the dataflow architecture of one or more of the nodes. For example, a node in the system can include a hybrid threading fabric accelerator. The hybrid threading fabric accelerator can execute in a user space of the CNM system and can initiate its own threads or subthreads, which can operate in parallel. Each thread can map to a different loop iteration to thereby support multi-dimensional loops. With the capability to initiate such nested loops, among other capabilities, the CNM system can realize significant time savings and latency improvements for compute-intensive operations.

In some examples, a compute-near-memory system is programmed to arrange components of a reconfigurable compute fabric, such as the various HTFs described herein, into one or more synchronous flows. The reconfigurable compute fabric comprises one or more hardware flow controllers and one or more hardware compute elements that can be arranged to form one or more synchronous flows, as described herein.

A compute element comprises a compute element memory and a processor or other suitable logic circuitry forming a compute pipeline for processing received data. In some examples, a compute element comprises multiple parallel processing lanes, such as single instruction multiple data (SIMD) processing lanes. A compute element also comprises circuitry for sending and receiving synchronous and asynchronous messages to flow controllers, other compute elements, and other system components, as described herein. Example compute elements are described herein with respect to the tiles 504, 510, 512 of FIG. 5.

A flow controller comprises a processor or other logic circuitry for managing a synchronous flow, as described herein. The flow controller comprises circuitry for sending synchronous and asynchronous messages to compute elements, other flow controllers, and other system components, as described herein. In some examples, a flow controller is implemented using a tile base of one or more of the tiles 504, 510, 512 described herein.

A synchronous flow is a hardware arrangement in a reconfigurable compute fabric that comprises a hardware flow controller and an ordered synchronous data path between a set of one or more hardware compute elements.

A synchronous flow may execute one or more threads of work. To execute a thread, the hardware components of the synchronous flow pass synchronous messages and execute a predetermined set of operations in the order of the synchronous flow. The flow controller of a synchronous flow initiates a thread at the synchronous flow by providing a first synchronous message to a first compute element of the synchronous flow. The first synchronous message includes data (e.g., data for processing by the compute elements) and may also include control information providing the compute element with various flags and other configuration and/or instruction data. The first compute element is programmed to perform one or more operations, for example, based on the data provided by the first synchronous message. The first compute element generates a second synchronous message that may also include data and control information. For example, the second synchronous message may describe results of the one or more operations executed by the first compute element.

The first compute element provides the second synchronous message to a next compute element according to the order of the synchronous flow. The next compute element of the synchronous flow can be another compute element of the reconfigurable compute fabric, although in some examples, a single compute element can perform consecutive operations of the synchronous flow, meaning that a compute element of a synchronous flow can, in some arrangements, direct a synchronous message to itself. The next compute element is programmed to perform one or more operations, which may include preparing and sending a third synchronous message to a subsequent compute element.

The thread is completed when all of the compute elements of the synchronous flow have completed their programmed operations in the predetermined order of the synchronous flow. When a thread has completed, a pipeline of synchronous messages will have propagated between the various compute elements in the predetermined order of the synchronous flow, beginning at the flow controller. Because the arrangement is synchronous, the completion of a thread may occur in a fixed amount of time (e.g., a predictable number of clock cycles from when the flow controller initiates the synchronous flow).

Arrangements of HTFs to include synchronous flows may facilitate parallel processing. For example, a flow controller for a synchronous flow need not wait for one thread to complete before initiating an additional thread. Consider an example synchronous flow including a flow controller and multiple compute elements. The flow controller initiates a first thread by providing a synchronous message to the first compute element of the synchronous flow. The first compute element performs its processing and directs a second synchronous message to the next compute element, and so one. After the first compute element completes its processing and directs the synchronous message to the next compute element, the flow controller may initiate an additional thread at the synchronous flow, for example, by providing an additional synchronous message to the first compute element.

Additional parallelization of synchronous flows at a reconfigurable compute fabric can be obtained by utilizing compute elements that operate at a predefined cadence or Spoke Count, such as the various tiles described herein. For example, a compute element may use a predetermined number of clock cycles to perform various operations, such as receiving synchronous messages, performing processing operations, sending synchronous messages, etc. The compute element may be configured to receive a new synchronous message and begin operations for a thread while operations from a previous thread are still propagating through a compute element. The new thread can be a different thread of the same synchronous flow of the previous thread or can be a thread of a different synchronous flow.

A synchronous flow can use an asynchronous fabric of the reconfigurable compute fabric to communicate with other synchronous flows and/or other components of the reconfigurable compute fabric using asynchronous messages. For example, a flow controller may receive an asynchronous message from a dispatch interface and/or from another flow controller instructing the flow controller to begin a thread at a synchronous flow. The dispatch interface may interface between the reconfigurable compute fabric and other system components. Also, in some examples, a synchronous flow may send an asynchronous message to the dispatch interface to indicate completion of a thread.

Asynchronous messages may also be used by various synchronous flows to access external memory. For example, the reconfigurable compute fabric may include one or more memory interfaces. Memory interfaces are hardware components that are used by a synchronous flow or components thereof to access an external memory that is not part of the synchronous flow. A thread executed at a synchronous flow may include sending a read and/or write request to a memory interface. Because reads and writes are asynchronous, the thread that initiates a read or write request to the memory interface may not receive the results of the request. Instead, the results of a read or write request may be provided to a different thread executed at a different synchronous flow.

Consider an example reconfigurable compute fabric that is arranged with a first synchronous flow for initiating a read request and a second synchronous flow for receiving the results of the read request. A first thread at the first synchronous flow sends an asynchronous read request message to a memory interface. The first thread may also send an asynchronous continue-type message to the flow controller of the second synchronous flow, where the continue message indicates the read request. The memory interface acquires the requested data from the memory and directs the read data to an appropriate compute element of the second synchronous flow. The compute element then directs an asynchronous message to the second flow controller indicating that the data has been received. (In some examples, the memory interface provides the read data directly to the second flow controller.) After receiving an indication that the read data has been received, the second flow controller initiates a thread at the second synchronous flow to further process the result of the read request.

In some examples, a reconfigurable compute fabric, such as the HFTs described herein, is used to execute one or more loops, such as a set of nested loops as described herein. To execute a loop, the reconfigurable compute fabric utilizes flow controllers and compute elements arranged into one or more synchronous flows, as described herein. For example, the flow controller for a synchronous flow may initiate a thread at the synchronous flow for each iteration of a loop. Consider the simple example loop given by code segment [1] below:

```
for i=1, 10 {
    x[i]=x[i-1]*2;
    saveMem = x[i];
}
```
[1]

A flow controller may begin the example loop by initiating a first thread at the synchronous flow for an i=1 loop iteration. In this example, an initial value for x[i−1] is passed by the flow controller to the first compute element with the payload data of the initial synchronous message. The compute element or elements of the synchronous flow determines a value for x[1] and returns the value for x[1] to the flow controller as a synchronous or asynchronous message. The flow controller then initiates a second thread at the synchronous flow for the i=2 loop iteration, passing the returned value of x[1] as x[i−1] in a synchronous message. This process continues until all iterations of the loop are completed and a value for x[10] is returned.

The example loop above uses a single synchronous flow for each iteration of the loop. In some examples, however, multiple synchronous flows can be used for each loop iteration. Consider the example loop given by code segment [2] below:

```
for i=1, 10 {
    x[i]=i*y[i];
    saveMem = x[i];
}
```
[2]

In this example, each loop iteration involves multiplying i by a value y[i] read from memory, and then writing the result to memory. Accordingly, each loop iteration includes an asynchronous memory read and an asynchronous memory write. As described herein, the memory read involves sending an asynchronous message to a memory interface and then waiting for the memory interface to reply with another asynchronous message including the requested data. Because the memory read is asynchronous, each loop iteration may use synchronous flow threads executing at two different synchronous flows. For the i=1 loop iteration, a thread at a first synchronous flow sends an asynchronous message to the memory interface including a read request for the value of y[1]. The thread at the first synchronous flow may also send an asynchronous message to a second flow controller of the second synchronous flow instructing the second flow controller to expect the result of the read request (either directly from the memory interface or from a compute element of the second synchronous flow that has received the read data). The memory interface initiates a read of the value of y[1] and provides the value of y[1] to the second synchronous flow via an asynchronous message. Upon receiving an asynchronous message indicating that the read data is received, the second flow controller initiates a thread at the second synchronous flow. (The returned value of y[1] can be provided to the compute elements, for example, via synchronous communications of the thread and/or directly from the memory interface prior to initiation of the thread.) The second thread determines the value of x[1] and sends a synchronous message to the memory interface including a write request for x[1].

In some examples, the number of threads that a synchronous flow controller can initiate at a synchronous flow is limited by the resources of the components of the synchronous flow. For example, threads of a synchronous flow may write data to the various local compute element memories at the synchronous flow compute elements. If too many synchronous flow threads are initiated at the same time, some synchronous flow threads may lack sufficient local memory or other resources at the hybrid threading fabric. This may prevent a synchronous flow thread from writing its data and/or cause it to overwrite the locally-stored data of other synchronous flow threads.

To prevent this, a reconfigurable compute fabric may limit the number of synchronous flow threads that can be initiated at a given time. For example, the reconfigurable compute fabric may implement a pool of thread identifiers (IDs). A flow controller may determine that a thread ID is available before implementing a synchronous flow thread. In some examples, the synchronous messages of a synchronous flow thread may include an indication of the thread ID for a given thread.

When a synchronous flow thread is complete, it may send an asynchronous free message, for example, to the flow controller that initiated the synchronous flow thread. This indicates to the flow controller that the thread ID (and associated resources) for the completed synchronous flow thread are now available for use by a new synchronous flow thread.

In some examples, a single thread ID can be used at more than one synchronous flow at the same time. For example, when a single string of operations is executed at more than one synchronous flow, corresponding threads at the multiple synchronous flows may utilize the same thread ID. Consider again the example of code segment [2]. Recall that for the i=1 loop iteration, the thread at the first synchronous flow sends the asynchronous message to the memory interface with the read request for the value of y[1] and an asynchronous continue-type message to the second flow controller of the second synchronous flow. When the value of y[1] is received at the second synchronous flow, the second flow controller initiates a thread at the second synchronous flow. In this example, the i=1 thread at the first synchronous flow and the i=1 thread at the second synchronous flow may use a common thread ID (and associated resources).

Also, in some examples, thread IDs may be described by different levels, with different numbers of thread IDs (and corresponding resources) available at different levels. Consider a nested loop. Synchronous flow threads executing a first-level loop of the nested loop may be assigned a thread ID (and corresponding resources) from a first-level thread pool. Synchronous flow threads from a second-level loop may be assigned thread IDs (and corresponding resources) from a second-level thread pool, and so on.

Figure 6A:
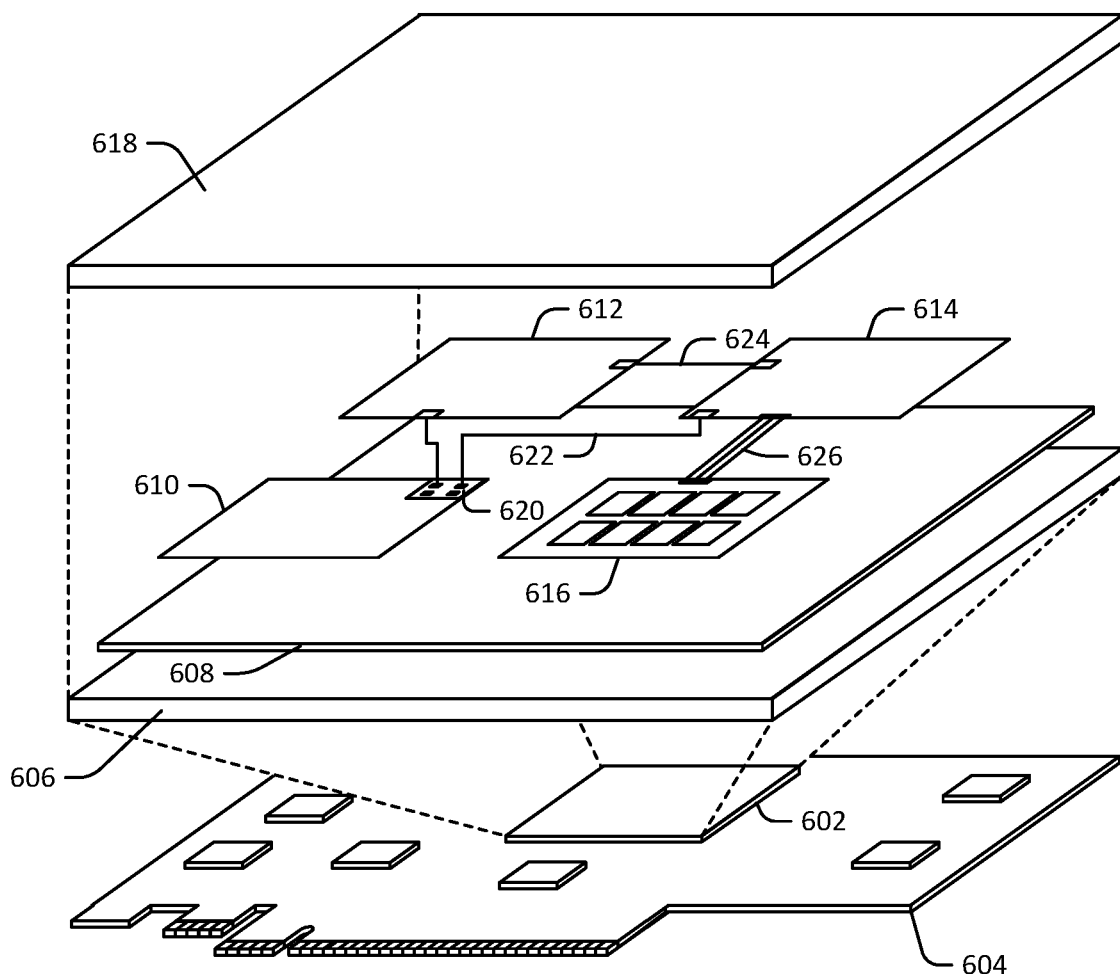
FIG. 6A illustrates generally an example of a chiplet system, according to an embodiment.
Figure 6B:
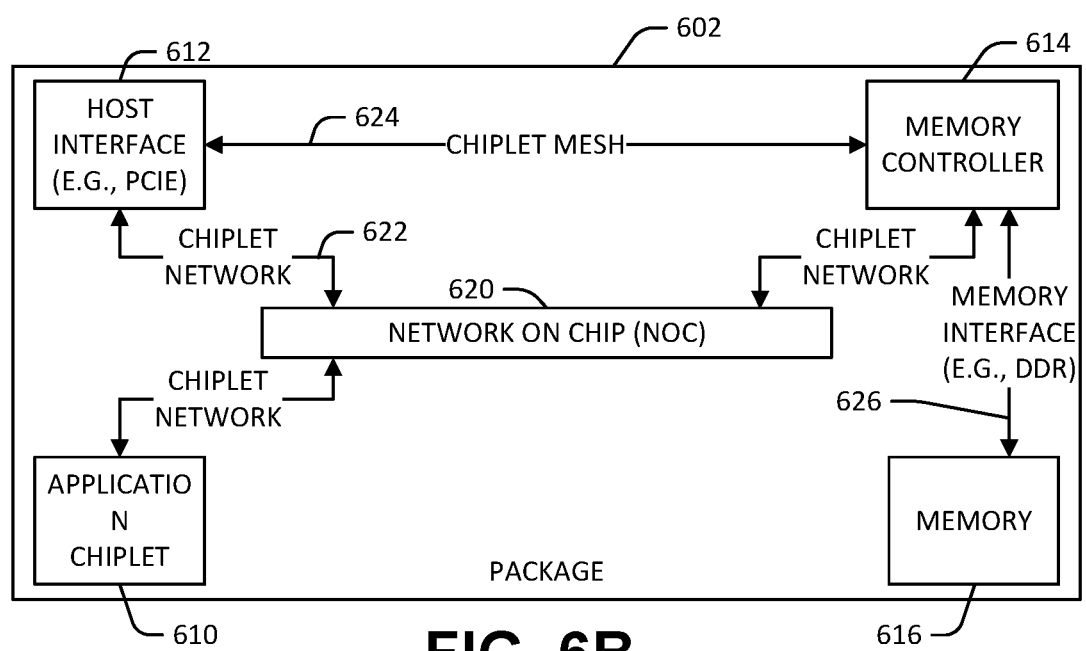
FIG. 6B illustrates generally a block diagram showing various components in the chiplet system from the example of FIG. 6A.

In some examples, thread IDs may be tracked by flow controllers based on the asynchronous message received by the flow controller to instruct the flow controller to begin initiating synchronous flow threads. Consider an example in which a dispatch interface sends an asynchronous loop message to a flow controller of a synchronous flow. The loop message may indicate the number of loop iterations that are to be executed, the number of thread IDs available, and, in some examples, a condition or conditions under which a previously-used thread ID becomes available again. For example, a thread ID used by a flow controller to initiate a synchronous flow thread may be available again when that synchronous flow thread completes (if the single thread ID is used at just one synchronous flow) or when a subsequent synchronous flow thread at a different synchronous flow completes (if the single thread ID is used at more than one synchronous flow, as described herein). A compute-near-memory system, or nodes or components of a compute-near-memory system, can include or use various memory devices, controllers, and interconnects, among other things. In an example, the system can comprise various interconnected nodes and the nodes, or groups of nodes, can be implemented using chiplets. Chiplets are an emerging technique for integrating various processing functionality. Generally, a chiplet system is made up of discrete chips (e.g., integrated circuits (ICs) on different substrate or die) that are integrated on an interposer and packaged together. This arrangement is distinct from single chips (e.g., ICs) that contain distinct device blocks (e.g., intellectual property (IP) blocks) on one substrate (e.g., single die), such as a system-on-a-chip (SoC), or discretely packaged devices integrated on a board. In general, chiplets provide production benefits than single die chips, including higher yields or reduced development costs. FIG. 6A and FIG. 6B, discussed below, illustrate generally an example of a chiplet system such as can comprise a compute-near-memory system.

When a synchronous flow is used to execute a loop, the synchronous flow threads executing different iterations of the loop may have need to read data from and/or write data to external memory (e.g., memory other than local compute element memory or tile memory). For example, during execution of a synchronous flow thread implementing all or part of a loop iteration, a compute element may make loop-iteration specific reads from or writes to external memory via a memory interface.

When compute elements of a synchronous flow read from and/or write to external memory while executing iterations of a loop, it is sometimes desirable for the compute elements to read from and/or write to memory locations that are specific to the loop iteration being executed. For example, if a synchronous flow thread executing a first loop iteration reads operand data from a first location at a compute element memory, the synchronous flow thread executing the second iteration may read its operand data from a different location. The synchronous flow thread executing the third iteration may read its operand data from still a different location, and so on. Similarly, synchronous flows may be arranged such that threads write result data to loop iteration-specific memory locations.

One way of causing synchronous flow compute elements to read from and write to loop-iteration specific memory locations is to use an iteration index. An iteration index is derived from the iteration number of a loop and points to specific memory location or set of memory locations that can be read from and/or written to during execution of the iteration. When a synchronous flow compute element reads from or writes to memory, it uses the iteration index to refer to iteration-specific memory locations.

Consider the example code segment [2] above. Compute elements at the first and second synchronous flows can use the iteration number i to derive an iteration index. In the example of code segment [2], each iteration of the i loop uses two memory locations. Operand data x[i] is read from a memory location and output data y[i] is written to a memory location. Accordingly, a simple iteration index can be determined by simply multiplying the i value for an iteration by two.

Consider another example given by code segment [3] below:

```
for x=1, 2048 {
  for y=1, 2048 {
    s[x,y] = 5*r[x,y]
    saveMem = s [x,y]
  }
}
```
[3]

This example includes a nested loop with a first-level x loop and a second-level y loop. In this example, the first-level x loop will execute 2048 times, for values of x from 1 to 2048. The second level y loop will execute 2048 times for each iteration of the outer loop, for a total of 4,235,364 iterations. It may be desirable to determine an iteration index for the code segment that has a unique value for each of the 4,235,364 iterations. In some examples, this can be accomplished by generating an iteration index from the iteration number of the first-level loop and the iteration of the second-level loop. With code segment [3], a unique iteration index may be derived by performing an operation on the first-level x loop iteration number and the second-level y loop iteration number. For example, an iteration index for the loop iteration where x=588 and y=2043 may be derived by performing an operation on 588 and 2043.

An iteration index can be derived during execution of a loop. Deriving an iteration index in a synchronous flow, however, may involve using additional compute element resources or even structuring the synchronous flow with additional compute elements. For example, referring to the code segment [3] above, a synchronous flow for calculating the value s[x,y] may include a compute element that pulls the value r[x,y] from compute element memory, performs the indicated multiplication, and writes the result s[x,y] back to the compute element memory. The compute element may first, however, derive an iteration index that is then used to read r[x,y] from the proper compute element memory location and write s[x,y] to the property compute element memory location. The iteration index can be derived at the compute element or, in some examples, may use an additional compute element positioned prior to the first compute element. This may lead to an inefficient use of compute elements.

Further, in some reconfigurable compute fabrics, calculating an iteration index may not be the best of use of a compute element. Consider again the example code segment [3] above. In this example, generating an iteration index involves processing two 12-bit values (representing 1-2048). In various examples, however, the compute elements of a reconfigurable compute fabric are arranged to operate on data that is wider, or even much wider than 12 bits. In some examples described herein, compute elements may be arranged to operation on a 512-bit data path. Using one or more cycles of a 512-bit data path to perform operations on 12-bit values may not be efficient. Accordingly, in some examples, a flow controller is configured to generate an iteration index. The generated iteration index is then passed to compute elements of a synchronous flow via synchronous messages, such as with the control information passed between compute elements during execution of a synchronous flow thread.

In some examples, a reconfigurable compute fabric is used to execute two or more nested loops in order to generate values for a multi-dimensional array. Each iteration of the nested loop may generate one (or more) values of multi-dimensional array where the inner loop iteration corresponds to one dimension of the multi-dimensional array and the outer loop iteration corresponds to another dimension of the multi-dimensional array. Consider again the example code segment [3] above. In this example, each iteration of the nested loop generates a value of the multi-dimensional array s[x,y]. The coordinates of the value generated by each iteration are given by the values of the outer loop iteration and the inner loop iteration. For example, in example code segment [3] the result of the iteration where x=321 and y=832 is the multi-dimensional array value s[321,832].

In some examples, it is desirable for a reconfigurable compute fabric to store a multi-dimensional array at an external memory. For example, an array stored at one or more compute element memories, while being easily accessible to synchronous flows, may not be accessible to other components of a compute-near-memory system. Also, in some examples, a multi-dimensional array may be generated using more than one synchronous flow. Referring again to the example code segment [3], the x and y iterations of some range of the x and or y iterations may be executed by one synchronous flow and another range by another synchronous flow. For example, one synchronous flow may execute iterations where x is between 1 and 64. Another synchronous flow may execute iterations where x is between 65 and 128, and so on.

When a multi-dimensional array is stored at an external memory, it may be desirable to store the values of the multi-dimensional array based on the position of those values in the array. Illustrating again with the example code segment [3], it may be desirable for the values of the array s[x,y] to be stored at external memory at positions that identify the corresponding x and y positions of the values. This may make it simpler for other components to later access the array. Writing the array values to external memory locations that identify dimensional positions of the array values, however, can encounter at least two obstacles. For example, external memory location addresses may be linear or, if not linear, may not match the dimensions of the multi-dimensional array. One might address this by simply writing the array values to memory locations assigned in the order that the values are written. This approach, however, may present challenges in a reconfigurable compute fabric or another arrangement where the values of the array may not be determined in order. For example, if the synchronous flow thread or threads determining the value of s[1,3] completes before the synchronous flow thread or threads determining the value of s[1,1], then those values may be written out of order.

Various examples address these and other challenges by configuring the memory interface to convert an iteration index, or other iteration indicator, into an external memory offset. Consider again the example code segment [3]. A synchronous flow thread executing an iteration of the inner "y" loop may receive or calculate an iteration index indicating the iteration of the outer "x" loop and the iteration of the inner "y" loop. To save the value s[x,y] to external memory, the thread may send an asynchronous write request including payload data (s[x,y] in this example) as well as the iteration index or other indicators of the corresponding iterations of the x and y loops. The memory interface may convert the iteration index or other indicators of the loop iterations to a corresponding external memory offset and write the payload data to one or more external memory locations indicated by the external memory offset relative to a base address.

FIG. 1 illustrates generally a first example of a compute-near-memory system, or CNM system 102. The example of the CNM system 102 includes multiple different memory-compute nodes, such as can each include various compute-near-memory devices. Each node in the system can operate in its own operating system (OS) domain (e.g., Linux, among others). In an example, the nodes can exist collectively in a common OS domain of the CNM system 102.

The example of FIG. 1 includes an example of a first memory-compute node 104 of the CNM system 102. The CNM system 102 can have multiple nodes, such as including different instances of the first memory-compute node 104, that are coupled using a scale fabric 106. In an example, the architecture of the CNM system 102 can support scaling with up to n different memory-compute nodes (e.g., n=2048) using the scale fabric 106. As further discussed below, each node in the CNM system 102 can be an assembly of multiple devices.

The CNM system 102 can include a global controller for the various nodes in the system, or a particular memory-compute node in the system can optionally serve as a host or controller to one or multiple other memory-compute nodes in the same system. The various nodes in the CNM system 102 can thus be similarly or differently configured.

In an example, each node in the CNM system 102 can comprise a host system that uses a specified operating system. The operating system can be common or different among the various nodes in the CNM system 102. In the example of FIG. 1, the first memory-compute node 104 comprises a host system 108, a first switch 110, and a first memory-compute device 112. The host system 108 can comprise a processor, such as can include an X86, ARM, RISC-V, or other type of processor. The first switch 110 can be configured to facilitate communication between or among devices of the first memory-compute node 104 or of the CNM system 102, such as using a specialized or other communication protocol, generally referred to herein as a chip-to-chip protocol interface (CTCPI). That is, the CTCPI can include a specialized interface that is unique to the CNM system 102, or can include or use other interfaces such as the compute express link (CXL) interface, the peripheral component interconnect express (PCIe) interface, or the chiplet protocol interface (CPI), among others. The first switch 110 can include a switch configured to use the CTCPI. For example, the first switch 110 can include a CXL switch, a PCIe switch, a CPI switch, or other type of switch. In an example, the first switch 110 can be configured to couple differently configured endpoints. For example, the first switch 110 can be configured to convert packet formats, such as between PCIe and CPI formats, among others.

The CNM system 102 is described herein in various example configurations, such as comprising a system of nodes, and each node can comprise various chips (e.g., a processor, a switch, a memory device, etc.). In an example, the first memory-compute node 104 in the CNM system 102 can include various chips implemented using chiplets. In the below-discussed chiplet-based configuration of the CNM system 102, inter-chiplet communications, as well as additional communications within the system, can use a CPI network. The CPI network described herein is an example of the CTCPI, that is, as a chiplet-specific implementation of the CTCPI. As a result, the below-described structure, operations, and functionality of CPI can apply equally to structures, operations, and functions as may be otherwise implemented using non-chiplet-based CTCPI implementations. Unless expressly indicated otherwise, any discussion herein of CPI applies equally to CTCPI.

A CPI interface includes a packet-based network that supports virtual channels to enable a flexible and high-speed interaction between chiplets, such as can comprise portions of the first memory-compute node 104 or the CNM system 102. The CPI can enable bridging from intra-chiplet networks to a broader chiplet network. For example, the Advanced eXtensible Interface (AXI) is a specification for intra-chip communications. AXI specifications, however, cover a variety of physical design options, such as the number of physical channels, signal timing, power, etc. Within a single chip, these options are generally selected to meet design goals, such as power consumption, speed, etc. However, to achieve the flexibility of a chiplet-based memory-compute system, an adapter, such as using CPI, can interface between the various AXI design options that can be implemented in the various chiplets. By enabling a physical channel-to-virtual channel mapping and encapsulating time-based signaling with a packetized protocol, CPI can be used to bridge intra-chiplet networks, such as within a particular memory-compute node, across a broader chiplet network, such as across the first memory-compute node 104 or across the CNM system 102.

The CNM system 102 is scalable to include multiple-node configurations. That is, multiple different instances of the first memory-compute node 104, or of other differently configured memory-compute nodes, can be coupled using the scale fabric 106, to provide a scaled system. Each of the memory-compute nodes can run its own operating system and can be configured to jointly coordinate system-wide resource usage.

In the example of FIG. 1, the first switch 110 of the first memory-compute node 104 is coupled to the scale fabric 106. The scale fabric 106 can provide a switch (e.g., a CTCPI switch, a PCIe switch, a CPI switch, or other switch) that can facilitate communication among and between different memory-compute nodes. In an example, the scale fabric 106 can help various nodes communicate in a partitioned global address space (PGAS).

In an example, the first switch 110 from the first memory-compute node 104 is coupled to one or multiple different memory-compute devices, such as including the first memory-compute device 112. The first memory-compute device 112 can comprise a chiplet-based architecture referred to herein as a compute-near-memory (CNM) chiplet. A packaged version of the first memory-compute device 112 can include, for example, one or multiple CNM chiplets. The chiplets can be communicatively coupled using CTCPI for high bandwidth and low latency.

In the example of FIG. 1, the first memory-compute device 112 can include a network on chip (NOC) or first NOC 118. Generally, a NOC is an interconnection network within a device, connecting a particular set of endpoints. In FIG. 1, the first NOC 118 can provide communications and connectivity between the various memory, compute resources, and ports of the first memory-compute device 112.

In an example, the first NOC 118 can comprise a folded Clos topology, such as within each instance of a memory-compute device, or as a mesh that couples multiple memory-compute devices in a node. The Clos topology, such as can use multiple, smaller radix crossbars to provide functionality associated with a higher radix crossbar topology, offers various benefits. For example, the Clos topology can exhibit consistent latency and bisection bandwidth across the NOC.

The first NOC 118 can include various distinct switch types including hub switches, edge switches, and endpoint switches. Each of the switches can be constructed as crossbars that provide substantially uniform latency and bandwidth between input and output nodes. In an example, the endpoint switches and the edge switches can include two separate crossbars, one for traffic headed to the hub switches, and the other for traffic headed away from the hub switches. The hub switches can be constructed as a single crossbar that switches all inputs to all outputs.

In an example, the hub switches can have multiple ports each (e.g., four or six ports each), such as depending on whether the particular hub switch participates in inter-chip communications. A number of hub switches that participates in inter-chip communications can be set by an inter-chip bandwidth requirement.

The first NOC 118 can support various payloads (e.g., from 8 to 64-byte payloads; other payload sizes can similarly be used) between compute elements and memory. In an example, the first NOC 118 can be optimized for relatively smaller payloads (e.g., 8-16 bytes) to efficiently handle access to sparse data structures.

In an example, the first NOC 118 can be coupled to an external host via a first physical-layer interface 114, a PCIe subordinate module 116 or endpoint, and a PCIe principal module 126 or root port. That is, the first physical-layer interface 114 can include an interface to allow an external host processor to be coupled to the first memory-compute device 112. An external host processor can optionally be coupled to one or multiple different memory-compute devices, such as using a PCIe switch or other, native protocol switch. Communication with the external host processor through a PCIe-based switch can limit device-to-device communication to that supported by the switch. Communication through a memory-compute device-native protocol switch such as using CTCPI, in contrast, can allow for more full communication between or among different memory-compute devices, including support for a partitioned global address space, such as for creating threads of work and sending events.

In an example, the CTCPI protocol can be used by the first NOC 118 in the first memory-compute device 112, and the first switch 110 can include a CTCPI switch. The CTCPI switch can allow CTCPI packets to be transferred from a source memory-compute device, such as the first memory-compute device 112, to a different, destination memory-compute device (e.g., on the same or other node), such as without being converted to another packet format.

In an example, the first memory-compute device 112 can include an internal host processor 122. The internal host processor 122 can be configured to communicate with the first NOC 118 or other components or modules of the first memory-compute device 112, for example, using the internal PCIe principal module 126, which can help eliminate a physical layer that would consume time and energy. In an example, the internal host processor 122 can be based on a RISC-V ISA processor, and can use the first physical-layer interface 114 to communicate outside of the first memory-compute device 112, such as to other storage, networking, or other peripherals to the first memory-compute device 112. The internal host processor 122 can control the first memory-compute device 112 and can act as a proxy for operating system-related functionality. The internal host processor 122 can include a relatively small number of processing cores (e.g., 2-4 cores) and a host memory device 124 (e.g., comprising a DRAM module).

In an example, the internal host processor 122 can include PCI root ports. When the internal host processor 122 is in use, then one of its root ports can be connected to the PCIe subordinate module 116. Another of the root ports of the internal host processor 122 can be connected to the first physical-layer interface 114, such as to provide communication with external PCI peripherals. When the internal host processor 122 is disabled, then the PCIe subordinate module 116 can be coupled to the first physical-layer interface 114 to allow an external host processor to communicate with the first NOC 118. In an example of a system with multiple memory-compute devices, the first memory-compute device 112 can be configured to act as a system host or controller. In this example, the internal host processor 122 can be in use, and other instances of internal host processors in the respective other memory-compute devices can be disabled.

The internal host processor 122 can be configured at power-up of the first memory-compute device 112, such as to allow the host to initialize. In an example, the internal host processor 122 and its associated data paths (e.g., including the first physical-layer interface 114, the PCIe subordinate module 116, etc.) can be configured from input pins to the first memory-compute device 112. One or more of the pins can be used to enable or disable the internal host processor 122 and configure the PCI (or other) data paths accordingly.

In an example, the first NOC 118 can be coupled to the scale fabric 106 via a scale fabric interface module 136 and a second physical-layer interface 138. The scale fabric interface module 136, or SIF, can facilitate communication between the first memory-compute device 112 and a device space, such as a partitioned global address space (PGAS). The PGAS can be configured such that a particular memory-compute device, such as the first memory-compute device 112, can access memory or other resources on a different memory-compute device (e.g., on the same or different node), such as using a load/store paradigm. Various scalable fabric technologies can be used, including CTCPI, CPI, Gen-Z, PCI, or Ethernet bridged over CXL. The scale fabric 106 can be configured to support various packet formats. In an example, the scale fabric 106 supports orderless packet communications, or supports ordered packets such as can use a path identifier to spread bandwidth across multiple equivalent paths. The scale fabric 106 can generally support remote operations such as remote memory read, write, and other built-in atomics, remote memory atomics, remote memory-compute device send events, and remote memory-compute device call and return operations.

In an example, the first NOC 118 can be coupled to one or multiple different memory modules, such as including a first memory device 128. The first memory device 128 can include various kinds of memory devices, for example, LPDDR5 or GDDR6, among others. In the example of FIG. 1, the first NOC 118 can coordinate communications with the first memory device 128 via a memory controller 130 that can be dedicated to the particular memory module. In an example, the memory controller 130 can include a memory module cache and an atomic operations module. The atomic operations module can be configured to provide relatively high-throughput atomic operators, such as including integer and floating-point operators. The atomic operations module can be configured to apply its operators to data within the memory module cache (e.g., comprising SRAM memory side cache), thereby allowing back-to-back atomic operations using the same memory location, with minimal throughput degradation.

The memory module cache can provide storage for frequently accessed memory locations, such as without having to re-access the first memory device 128. In an example, the memory module cache can be configured to cache data only for a particular instance of the memory controller 130. In an example, the memory controller 130 includes a DRAM controller configured to interface with the first memory device 128, such as including DRAM devices. The memory controller 130 can provide access scheduling and bit error management, among other functions.

In an example, the first NOC 118 can be coupled to a hybrid threading processor (HTP 140), a hybrid threading fabric (HTF 142) and a host interface and dispatch module (HIF 120). The HIF 120 can be configured to facilitate access to host-based command request queues and response queues. In an example, the HIF 120 can dispatch new threads of execution on processor or compute elements of the HTP 140 or the HTF 142. In an example, the HIF 120 can be configured to maintain workload balance across the HTP 140 module and the HTF 142 module.

The hybrid threading processor, or HTP 140, can include an accelerator, such as can be based on a RISC-V instruction set. The HTP 140 can include a highly threaded, event-driven processor in which threads can be executed in single instruction rotation, such as to maintain high instruction throughput. The HTP 140 comprises relatively few custom instructions to support low-overhead threading capabilities, event send/receive, and shared memory atomic operators.

The hybrid threading fabric, or HTF 142, can include an accelerator, such as can include a non-von Neumann, coarse-grained, reconfigurable processor. The HTF 142 can be optimized for high-level language operations and data types (e.g., integer or floating point). In an example, the HTF 142 can support data flow computing. The HTF 142 can be configured to use substantially all of the memory bandwidth available on the first memory-compute device 112, such as when executing memory-bound compute kernels.

The HTP and HTF accelerators of the CNM system 102 can be programmed using various high-level, structured programming languages. For example, the HTP and HTF accelerators can be programmed using C/C++, such as using the LLVM compiler framework. The HTP accelerator can leverage an open source compiler environment, such as with various added custom instruction sets configured to improve memory access efficiency, provide a message passing mechanism, and manage events, among other things. In an example, the HTF accelerator can be designed to enable programming of the HTF 142 using a high-level programming language, and the compiler can generate a simulator configuration file or a binary file that runs on the HTF 142 hardware. The HTF 142 can provide a mid-level language for expressing algorithms precisely and concisely, while hiding configuration details of the HTF accelerator itself. In an example, the HTF accelerator tool chain can use an LLVM front-end compiler and the LLVM intermediate representation (IR) to interface with an HTF accelerator back end.

Figure 2:
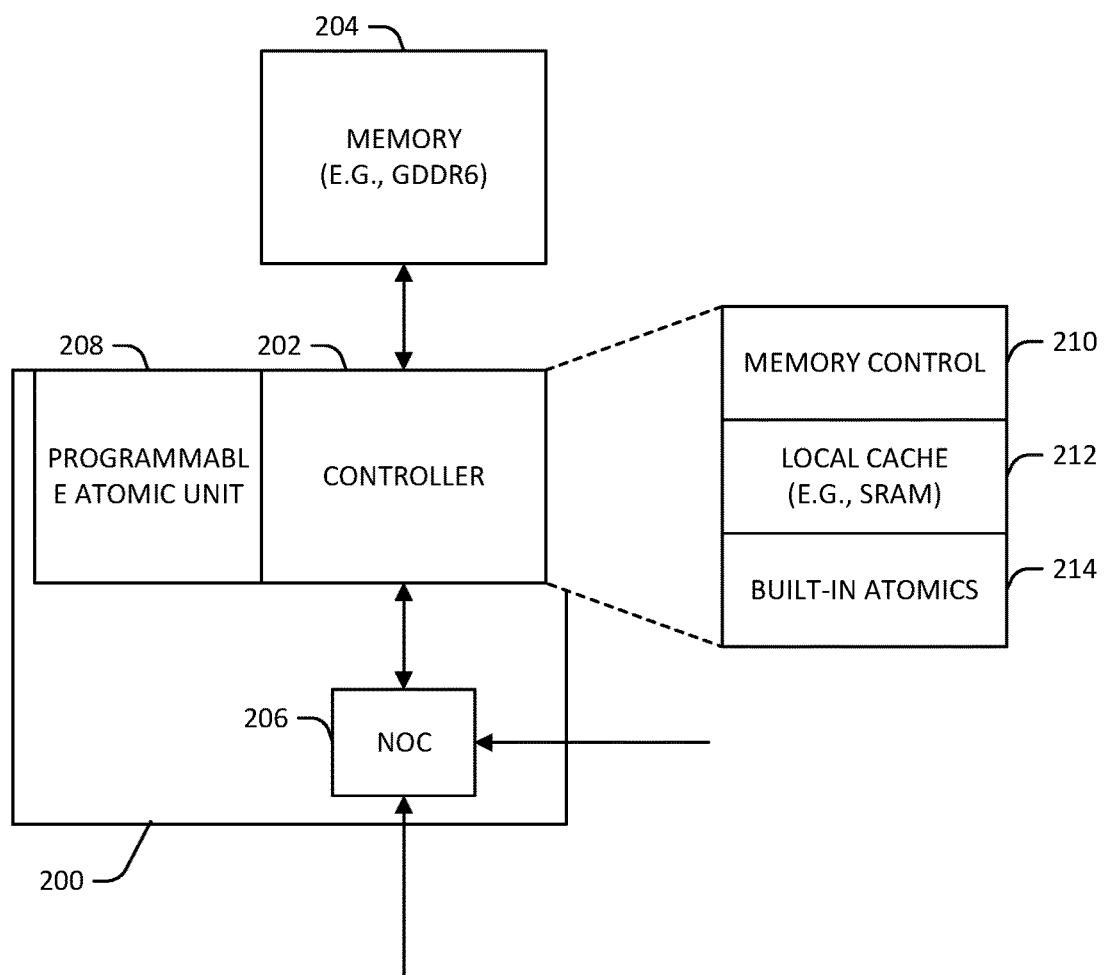
FIG. 2 illustrates generally an example of a memory subsystem of a memory-compute device, according to an embodiment.

FIG. 2 illustrates generally an example of a memory subsystem 200 of a memory-compute device, according to an embodiment. The example of the memory subsystem 200 includes a controller 202, a programmable atomic unit 208, and a second NOC 206. The controller 202 can include or use the programmable atomic unit 208 to carry out operations using information in a memory device 204. In an example, the memory subsystem 200 comprises a portion of the first memory-compute device 112 from the example of FIG. 1, such as including portions of the first NOC 118 or of the memory controller 130.

In the example of FIG. 2, the second NOC 206 is coupled to the controller 202 and the controller 202 can include a memory control module 210, a local cache module 212, and a built-in atomics module 214. In an example, the built-in atomics module 214 can be configured to handle relatively simple, single-cycle, integer atomics. The built-in atomics module 214 can perform atomics at the same throughput as, for example, normal memory read or write operations. In an example, an atomic memory operation can include a combination of storing data to the memory, performing an atomic memory operation, and then responding with load data from the memory.

The local cache module 212, such as can include an SRAM cache, can be provided to help reduce latency for repetitively-accessed memory locations. In an example, the local cache module 212 can provide a read buffer for sub-memory line accesses. The local cache module 212 can be particularly beneficial for compute elements that have relatively small or no data caches.

The memory control module 210, such as can include a DRAM controller, can provide low-level request buffering and scheduling, such as to provide efficient access to the memory device 204, such as can include a DRAM device. In an example, the memory device 204 can include or use a GDDR6 DRAM device, such as having 16 Gb density and 64 Gb/sec peak bandwidth. Other devices can similarly be used.

In an example, the programmable atomic unit 208 can comprise single-cycle or multiple-cycle operator such as can be configured to perform integer addition or more complicated multiple-instruction operations such as bloom filter insert. In an example, the programmable atomic unit 208 can be configured to perform load and store-to-memory operations. The programmable atomic unit 208 can be configured to leverage the RISC-V ISA with a set of specialized instructions to facilitate interactions with the controller 202 to atomically perform user-defined operations.

Programmable atomic requests, such as received from an on-node or off-node host, can be routed to the programmable atomic unit 208 via the second NOC 206 and the controller 202. In an example, custom atomic operations (e.g., carried out by the programmable atomic unit 208) can be identical to built-in atomic operations (e.g., carried out by the built-in atomics module 214) except that a programmable atomic operation can be defined or programmed by the user rather than the system architect. In an example, programmable atomic request packets can be sent through the second NOC 206 to the controller 202, and the controller 202 can identify the request as a custom atomic. The controller 202 can then forward the identified request to the programmable atomic unit 208.

Figure 3:
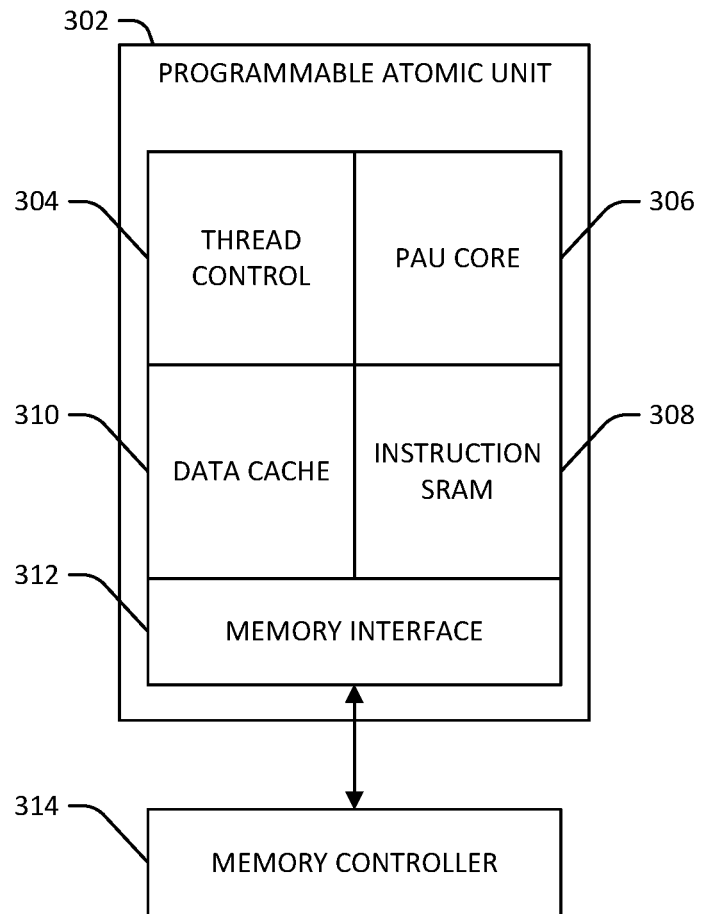
FIG. 3 illustrates generally an example of a programmable atomic unit for a memory controller, according to an embodiment.

FIG. 3 illustrates generally an example of a programmable atomic unit 302 for use with a memory controller, according to an embodiment. In an example, the programmable atomic unit 302 can comprise or correspond to the programmable atomic unit 208 from the example of FIG. 2. That is, FIG. 3 illustrates components in an example of a programmable atomic unit 302 (PAU), such as those noted above with respect to FIG. 2 (e.g., in the programmable atomic unit 208), or to FIG. 1 (e.g., in an atomic operations module of the memory controller 130). As illustrated in FIG. 3, the programmable atomic unit 302 includes a PAU processor or PAU core 306, a PAU thread control 304, an instruction SRAM 308, a data cache 310, and a memory interface 312 to interface with the memory controller 314. In an example, the memory controller 314 comprises an example of the controller 202 from the example of FIG. 2.

In an example, the PAU core 306 is a pipelined processor such that multiple stages of different instructions are executed together per clock cycle. The PAU core 306 can include a barrel-multithreaded processor, with thread control 304 circuitry to switch between different register files (e.g., sets of registers containing current processing state) upon each clock cycle. This enables efficient context switching between currently executing threads. In an example, the PAU core 306 supports eight threads, resulting in eight register files. In an example, some or all of the register files are not integrated into the PAU core 306, but rather reside in a local data cache 310 or the instruction SRAM 308. This reduces circuit complexity in the PAU core 306 by eliminating the traditional flip-flops used for registers in such memories.

The local PAU memory can include instruction SRAM 308, such as can include instructions for various atomics. The instructions comprise sets of instructions to support various application-loaded atomic operators. When an atomic operator is requested, such as by an application chiplet, a set of instructions corresponding to the atomic operator are executed by the PAU core 306. In an example, the instruction SRAM 308 can be partitioned to establish the sets of instructions. In this example, the specific programmable atomic operator being requested by a requesting process can identify the programmable atomic operator by the partition number. The partition number can be established when the programmable atomic operator is registered with (e.g., loaded onto) the programmable atomic unit 302.

Other metadata for the programmable instructions can be stored in memory (e.g., in partition tables) in memory local to the programmable atomic unit 302.

In an example, atomic operators manipulate the data cache 310, which is generally synchronized (e.g., flushed) when a thread for an atomic operator completes. Thus, aside from initial loading from the external memory, such as from the memory controller 314, latency can be reduced for most memory operations during execution of a programmable atomic operator thread.

A pipelined processor, such as the PAU core 306, can experience an issue when an executing thread attempts to issue a memory request if an underlying hazard condition would prevent such a request. Here, the memory request is to retrieve data from the memory controller 314, whether it be from a cache on the memory controller 314 or off-die memory. To resolve this issue, the PAU core 306 is configured to deny the memory request for a thread. Generally, the PAU core 306 or the thread control 304 can include circuitry to enable one or more thread rescheduling points in the pipeline. Here, the denial occurs at a point in the pipeline that is beyond (e.g., after) these thread rescheduling points. In an example, the hazard occurred beyond the rescheduling point. Here, a preceding instruction in the thread created the hazard after the memory request instruction passed the last thread rescheduling point prior to the pipeline stage in which the memory request could be made.

In an example, to deny the memory request, the PAU core 306 is configured to determine (e.g., detect) that there is a hazard on memory indicated in the memory request. Here, hazard denotes any condition such that allowing (e.g., performing) the memory request will result in an inconsistent state for the thread. In an example, the hazard is an in-flight memory request. Here, whether or not the data cache 310 includes data for the requested memory address, the presence of the in-flight memory request makes it uncertain what the data in the data cache 310 at that address should be. Thus, the thread must wait for the in-flight memory request to be completed to operate on current data. The hazard is cleared when the memory request completes.

In an example, the hazard is a dirty cache line in the data cache 310 for the requested memory address. Although the dirty cache line generally indicates that the data in the cache is current and the memory controller version of this data is not, an issue can arise on thread instructions that do not operate from the cache. An example of such an instruction uses a built-in atomic operator, or other separate hardware block, of the memory controller 314. In the context of a memory controller, the built-in atomic operators can be separate from the programmable atomic unit 302 and do not have access to the cache or data cache 310 inside the PAU. If the cache line is dirty, then the built-in atomic operator will not be operating on the most current data until the cache is flushed to synchronize the cache and the other or off-die memories. This same situation could occur with other hardware blocks of the memory controller, such as cryptography block, encoder, etc.

Figure 4:
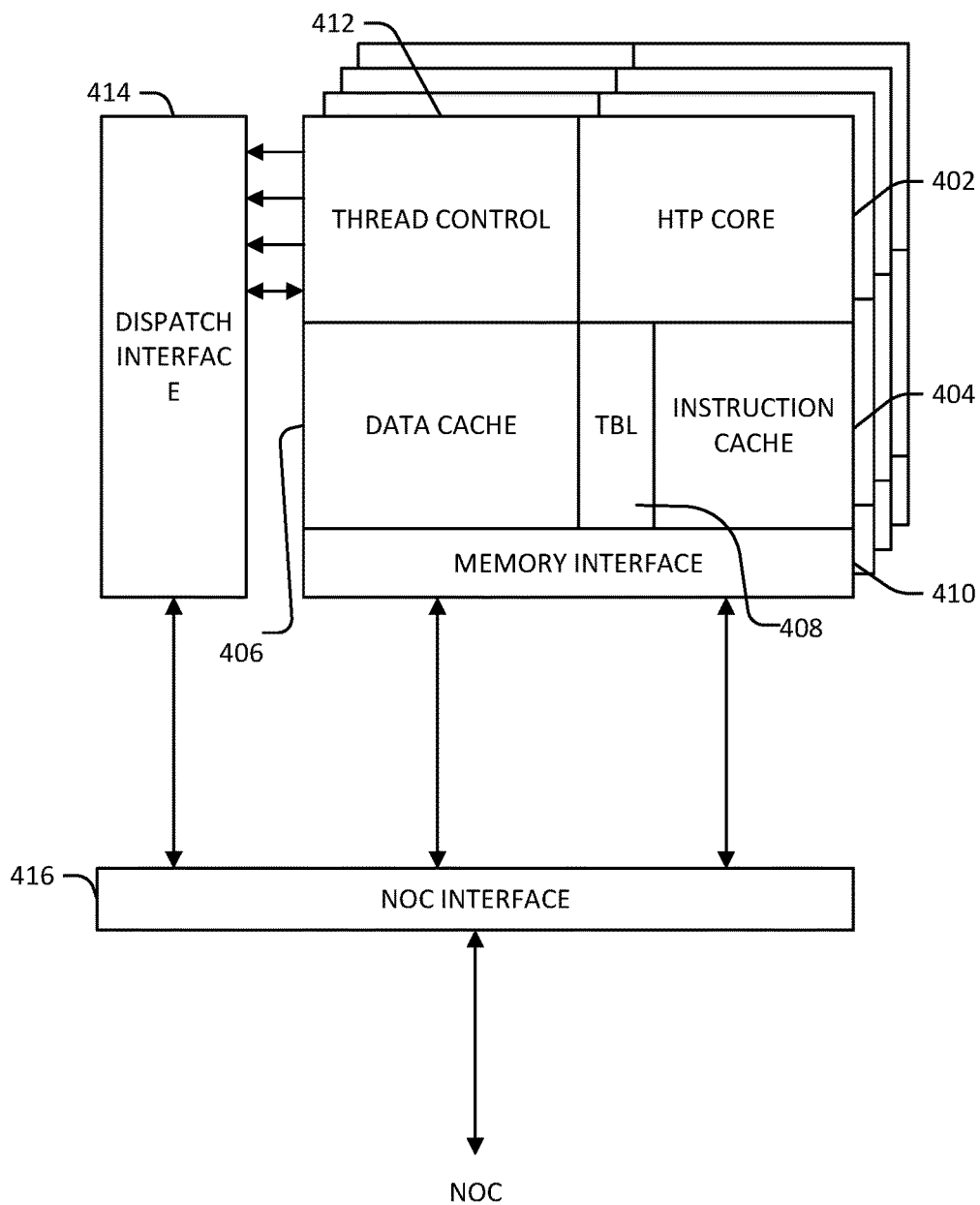
FIG. 4 illustrates an example of a hybrid threading processor (HTP) accelerator of a memory-compute device, according to an embodiment.

FIG. 4 illustrates an example of a hybrid threading processor (HTP) accelerator, or HTP accelerator 400. The HTP accelerator 400 can comprise a portion of a memory-compute device, according to an embodiment. In an example, the HTP accelerator 400 can include or comprise the HTP 140 from the example of FIG. 1. The HTP accelerator 400 includes, for example, an HTP core 402, an instruction cache 404, a data cache 406, a translation block 408, a memory interface 410, and a thread controller 412. The HTP accelerator 400 can further include a dispatch interface 414 and a NOC interface 416, such as for interfacing with a NOC such as the first NOC 118 from the example of FIG. 1, the second NOC 206 from the example of FIG. 2, or other NOC.

In an example, the HTP accelerator 400 includes a module that is based on a RISC-V instruction set, and can include a relatively small number of other or additional custom instructions to support a low-overhead, threading-capable Hybrid Threading (HT) language. The HTP accelerator 400 can include a highly-threaded processor core, the HTP core 402, in which, or with which, threads can be executed in a single instruction rotation, such as to maintain high instruction throughput. In an example, a thread can be paused when it waits for other, pending events to complete. This can allow the compute resources to be efficiently used on relevant work instead of polling. In an example, multiple-thread barrier synchronization can use efficient HTP-to-HTP and HTP-to/from-Host messaging, such as can allow thousands of threads to initialize or wake in, for example, tens of clock cycles.

In an example, the dispatch interface 414 can comprise a functional block of the HTP accelerator 400 for handling hardware-based thread management. That is, the dispatch interface 414 can manage dispatch of work to the HTP core 402 or other accelerators. Non-HTP accelerators, however, are generally not able to dispatch work. In an example, work dispatched from a host can use dispatch queues that reside in, e.g., host main memory (e.g., DRAM-based memory). Work dispatched from the HTP accelerator 400, on the other hand, can use dispatch queues that reside in SRAM, such as within the dispatches for the target HTP accelerator 400 within a particular node.

In an example, the HTP core 402 can comprise one or more cores that execute instructions on behalf of threads. That is, the HTP core 402 can include an instruction processing block. The HTP core 402 can further include, or can be coupled to, the thread controller 412. The thread controller 412 can provide thread control and state for each active thread within the HTP core 402. The data cache 406 can include cache for a host processor (e.g., for local and remote memory-compute devices, including for the HTP core 402), and the instruction cache 404 can include cache for use by the HTP core 402. In an example, the data cache 406 can be configured for read and write operations, and the instruction cache 404 can be configured for read only operations.

In an example, the data cache 406 is a small cache provided per hardware thread. The data cache 406 can temporarily store data for use by the owning thread. The data cache 406 can be managed by hardware or software in the HTP accelerator 400. For example, hardware can be configured to automatically allocate or evict lines as needed, as load and store operations are executed by the HTP core 402. Software, such as using RISC-V instructions, can determine which memory accesses should be cached, and when lines should be invalidated or written back to other memory locations.

Data caching on the HTP accelerator 400 has various benefits, including making larger accesses more efficient for the memory controller, allowing an executing thread to avoid stalling. However, there are situations when using the cache causes inefficiencies. An example includes accesses where data is accessed only once, and causes thrashing of the cache lines. To help address this problem, the HTP accelerator 400 can use a set of custom load instructions to force a load instruction to check for a cache hit, and on a cache miss to issue a memory request for the requested operand and not put the obtained data in the data cache 406. The HTP accelerator 400 thus includes various different types of load instructions, including non-cached and cache line loads. The non-cached load instructions use the cached data if dirty data is present in the cache. The non-cached load instructions ignore clean data in the cache, and do not write accessed data to the data cache. For cache line load instructions, the complete data cache line (e.g., comprising 64 bytes) can be loaded from memory into the data cache 406, and can load the addressed memory into a specified register. These loads can use the cached data if clean or dirty data is in the data cache 406. If the referenced memory location is not in the data cache 406, then the entire cache line can be accessed from memory. Use of the cache line load instructions can reduce cache misses when sequential memory locations are being referenced (such as memory copy operations) but can also waste memory and bandwidth at the NOC interface 416 if the referenced memory data is not used.

In an example, the HTP accelerator 400 includes a custom store instruction that is non-cached. The non-cached store instruction can help avoid thrashing the data cache 406 with write data that is not sequentially written to memory.

In an example, the HTP accelerator 400 further includes a translation block 408. The translation block 408 can include a virtual-to-physical translation block for local memory of a memory-compute device. For example, a host processor, such as in the HTP core 402, can execute a load or store instruction, and the instruction can generate a virtual address. The virtual address can be translated to a physical address of the host processor, such as using a translation table from the translation block 408. The memory interface 410, for example, can include an interface between the HTP core 402 and the NOC interface 416.

Figure 5:
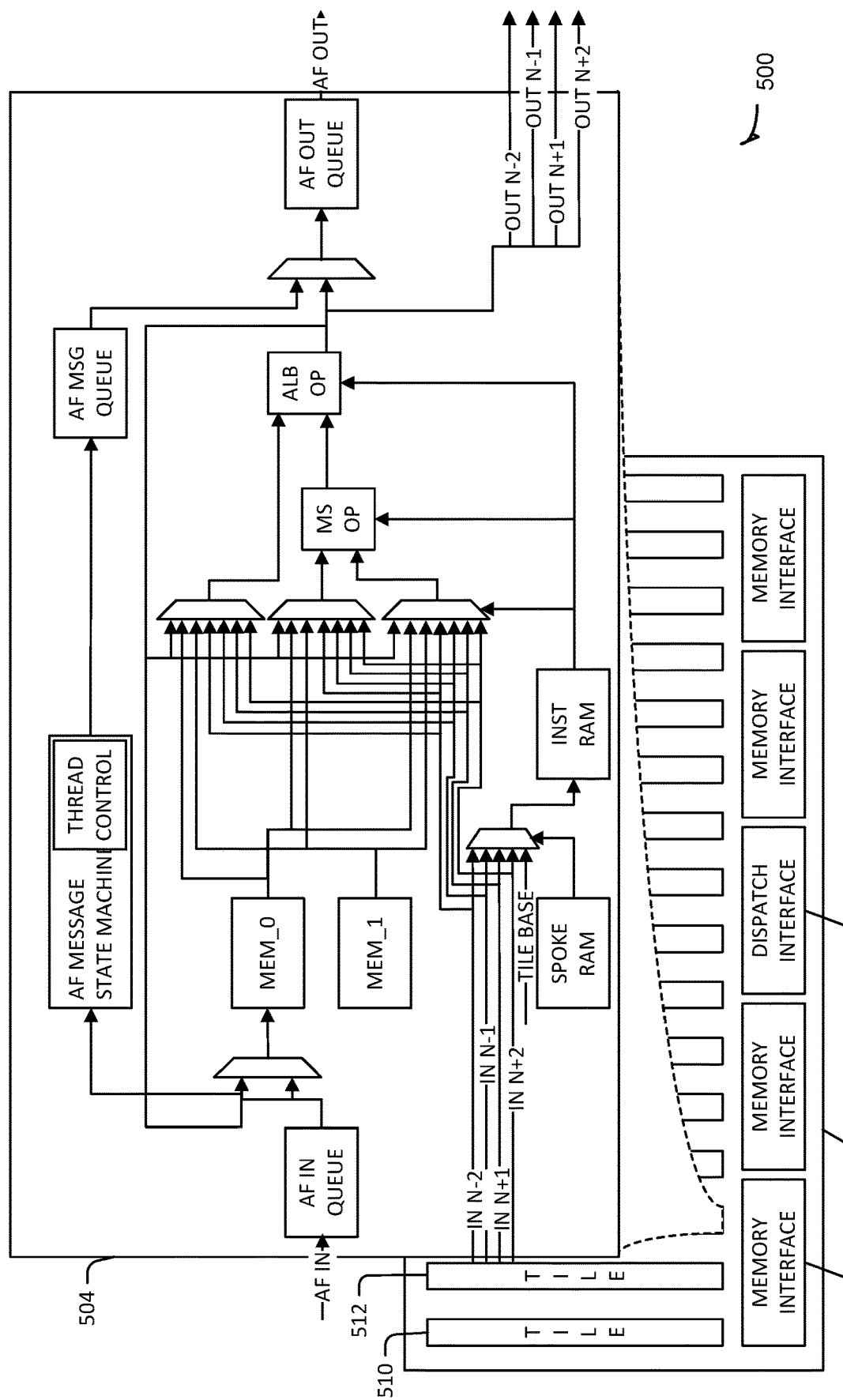
FIG. 5 illustrates an example of a representation of a hybrid threading fabric (HTF) of a memory-compute device, according to an embodiment.

FIG. 5 illustrates an example of a representation of a hybrid threading fabric (HTF), or HTF 500, of a memory-compute device, according to an embodiment. In an example, the HTF 500 can include or comprise the HTF 142 from the example of FIG. 1. The HTF 500 is a coarse-grained, reconfigurable compute fabric that can be optimized for high-level language operand types and operators (e.g., using C/C++ or other high-level language). In an example, the HTF 500 can include configurable, n-bit wide (e.g., 512-bit wide) data paths that interconnect hardened SIMD arithmetic units.

In an example, the HTF 500 comprises an HTF cluster 502 that includes multiple HTF tiles, including an example tile 504, or Tile N. Each HTF tile can implement one or more compute elements with local tile or compute element memory and arithmetic functions. For example, each tile can include a compute pipeline with support for integer and floating-point operations. In an example, the data path, compute elements, and other infrastructure can be implemented as hardened IP to provide maximum performance while minimizing power consumption and reconfiguration time.

In the example of FIG. 5, the tiles comprising the HTF cluster 502 are linearly arranged, and each tile in the cluster can be coupled to one or multiple other tiles in the HTF cluster 502. In the example of FIG. 5, the example tile 504, or Tile N, is coupled to four other tiles, including to a tile base of a tile 510 (e.g., Tile N−2) via the port labeled SF IN N−2, to an adjacent tile 512 (e.g., Tile N−1) via the port labeled SF IN N−1, and to a Tile N+1 via the port labeled SF IN N+1 and to a Tile N+2 via the port labeled SF IN N+2. The tile base is a hardware portion of a tile, such as tile 504, 510, 512, that is configured to initiate threads and/or otherwise act as a flow controller. The example tile 504 can be coupled to the same or other tiles via respective output ports, such as those labeled SF OUT N−1, SF OUT N−2, SF OUT N+1, and SF OUT N+2. In this example, the ordered list of names for the various tiles are notional indications of the positions of the tiles. In other examples, the tiles comprising the HTF cluster 502 can be arranged in a grid or other configuration, with each tile similarly coupled to one or several of its nearest neighbors in the grid. Tiles that are provided at an edge of a cluster can optionally have fewer connections to neighboring tiles. For example, Tile N−2, or the tile base at the tile 510 in the example of FIG. 5, can be coupled only to the adjacent tile 512 (Tile N−1) and to the example tile 504 (Tile N). Fewer or additional inter-tile connections can similarly be used.

The HTF cluster 502 can further include memory interface modules, including a first memory interface module 506. The memory interface modules can couple the HTF cluster 502 to a NOC, such as the first NOC 118. In an example, the memory interface modules can allow tiles within a cluster to make requests to other locations in a memory-compute system, such as in the same or different node in the system. That is, the representation of the HTF 500 can comprise a portion of a larger fabric that can be distributed across multiple nodes, such as with one or more HTF tiles or HTF clusters at each of the nodes. Requests can be made between tiles or nodes within the context of the larger fabric.

In the example of FIG. 5, the tiles in the HTF cluster 502 are coupled using a synchronous fabric (SF). The synchronous fabric can provide communication between a particular tile and its neighboring tiles in the HTF cluster 502, as described above. Each HTF cluster 502 can further include an asynchronous fabric (AF) that can provide communication among, e.g., the tiles in the cluster, the memory interfaces in the cluster, and a dispatch interface 508 in the cluster.

In an example, the synchronous fabric can exchange messages that include data and control information. The control information can include, among other things, instruction RAM address information or a thread identifier. The control information can be used to set up a data path, and a data message field can be selected as a source for the path. Generally, the control fields can be provided or received earlier, such that they can be used to configure the data path. For example, to help minimize any delay through the synchronous flow pipeline in a tile, the control information can arrive at a tile a few clock cycles before the data field. Various registers can be provided to help coordinate dataflow timing in the pipeline.

In an example, each tile in the HTF cluster 502 can include one or more tile memories. Each tile memory can have the same width as the data path (e.g., 512 bits) and can have a specified depth, such as in a range of 512 to 1024 elements. The tile memories can be used to store data that supports data path operations. The stored data can include constants loaded as part of a kernel's cluster configuration, for example, or can include variables calculated as part of the data flow. In an example, the tile memories can be written from the asynchronous fabric as a data transfer from another synchronous flow, or can include a result of a load operation such as initiated by another synchronous flow. The tile memory can be read via synchronous data path instruction execution in the synchronous flow.

In an example, each tile in an HTF cluster 502 can have a dedicated instruction RAM (INST RAM). In an example of an HTF cluster 502 with sixteen tiles, and respective instruction RAM instances with sixty-four entries, the cluster can allow algorithms to be mapped with up to 1024 multiply-shift and/or ALU operations. The various tiles can optionally be pipelined together, such as using the synchronous fabric, to allow data flow compute with minimal memory access, thus minimizing latency and reducing power consumption. In an example, the asynchronous fabric can allow memory references to proceed in parallel with computation, thereby providing more efficient streaming kernels. In an example, the various tiles can include built-in support for loop-based constructs, and can support nested looping kernels.

The synchronous fabric can allow multiple tiles (e.g., multiple compute elements thereof) to be pipelined, such as without a need for data queuing. Compute elements that participate in a synchronous flow can, for example, act as a single pipelined data path. A flow controller for a synchronous flow may be or include a tile (e.g., Tile N−2, in the example of FIG. 5), a compute element on a tile, and/or a tile base or controller on a tile. The flow controller of a synchronous flow can initiate a thread of work through the pipelined tiles. The flow controller can be responsible for starting a thread on a predefined cadence referred to herein as a Spoke Count. For example, if the Spoke Count is 3, then the tile base can initiate a thread every third clock cycle.

In an example, the synchronous flow comprises a set of connected compute elements in the HTF cluster 502. Execution of a thread can begin at the flow controller and can progress from the flow controller, via the synchronous fabric, to other compute elements (e.g., at other tiles in the same synchronous flow). The flow controller can provide the instruction to be executed for the first compute element. The first compute element can, by default, provide the same instruction for the other connected compute elements to execute. However, in some examples, the flow controller, or a subsequent compute element, can implement a conditional operation that conditionally specifies or uses an alternative instruction. The alternative instruction can be chosen by having the compute element's data path produce a Boolean conditional value, and then can use the Boolean value to choose between an instruction set of the current compute element and the alternate instruction.

The asynchronous fabric can be used to perform operations that occur asynchronously relative to a synchronous flow. Each tile in the HTF cluster 502 can include an interface to the asynchronous fabric. The inbound interface can include, for example, a FIFO buffer or queue (e.g., AF IN QUEUE) to provide storage for message that cannot be immediately processed. Similarly, the outbound interface of the asynchronous fabric can include a FIFO buffer or queue (e.g., AF OUT QUEUE) to provide storage for messages that cannot be immediately sent out.

In an example, messages in the asynchronous fabric can be classified as data messages or control messages. Data messages can include a SIMD width data value that is written to either tile memory 0 (MEM_0) or memory 1 (MEM_1). Control messages can be configured to control thread creation, to free resources, or to issue external memory references.

A tile in the HTF cluster 502 can perform various compute operations for the HTF. The compute operations can be performed by configuring the data path within the tile and/or compute elements thereof. In an example, a tile includes two functional blocks that perform the compute operations for the tile: a Multiply and Shift Operation block (MS OP) and an Arithmetic, Logical, and Bit Operation block (ALB OP).

The two blocks can be configured to perform pipelined operations such as a Multiply and Add, or a Shift and Add, among others.

In an example, each instance of a memory-compute device in a system can have a complete supported instruction set for its operator blocks (e.g., MS OP and ALB OP). In this case, binary compatibility can be realized across all devices in the system. However, in some examples, it can be helpful to maintain a base set of functionality and optional instruction set classes, such as to meet various design tradeoffs, such as die size. The approach can be similar to how the RISC-V instruction set has a base set and multiple optional instruction subsets.

In an example, the example tile 504 can include a Spoke RAM. The Spoke RAM can be used to specify which input (e.g., from among the four SF tile inputs and the tile base input) is the primary input for each clock cycle. The Spoke RAM read address input can originate at a counter that counts from zero to Spoke Count minus one. In an example, different spoke counts can be used on different tiles, such as within the same HTF cluster 502, to allow a number of slices, or unique tile instances, used by an inner loop to determine the performance of a particular application or instruction set. In an example, the Spoke RAM can specify when a synchronous input is to be written to a tile memory, for instance when multiple inputs for a particular tile instruction are used and one of the inputs arrives before the others. The early-arriving input can be written to the tile memory and can be later read when all of the inputs are available. In this example, the tile memory can be accessed as a FIFO memory, and FIFO read and write pointers can be stored in a register-based memory region or structure in the tile memory.

FIG. 6A and FIG. 6B illustrate generally an example of a chiplet system that can be used to implement one or more aspects of the CNM system 102. As similarly mentioned above, a node in the CNM system 102, or a device within a node in the CNM system 102, can include a chiplet-based architecture or compute-near-memory (CNM) chiplet. A packaged memory-compute device can include, for example, one, two, or four CNM chiplets. The chiplets can be interconnected using high-bandwidth, low-latency interconnects such as using a CPI interface. Generally, a chiplet system is made up of discrete modules (each a "chiplet") that are integrated on an interposer and, in many examples, are interconnected as desired through one or more established networks to provide a system with the desired functionality. The interposer and included chiplets can be packaged together to facilitate interconnection with other components of a larger system. Each chiplet can include one or more individual integrated circuits (ICs), or "chips," potentially in combination with discrete circuit components, and can be coupled to a respective substrate to facilitate attachment to the interposer. Most or all chiplets in a system can be individually configured for communication through established networks.

The configuration of chiplets as individual modules of a system is distinct from such a system being implemented on single chips that contain distinct device blocks (e.g., intellectual property (IP) blocks) on one substrate (e.g., single die), such as a system-on-a-chip (SoC), or multiple discrete packaged devices integrated on a printed circuit board (PCB). In general, chiplets provide better performance (e.g., lower power consumption, reduced latency, etc.) than discrete packaged devices, and chiplets provide greater production benefits than single die chips. These production benefits can include higher yields or reduced development costs and time.

Chiplet systems can include, for example, one or more application (or processor) chiplets and one or more support chiplets. Here, the distinction between application and support chiplets is simply a reference to the likely design scenarios for the chiplet system. Thus, for example, a synthetic vision chiplet system can include, by way of example only, an application chiplet to produce the synthetic vision output along with support chiplets, such as a memory controller chiplet, a sensor interface chiplet, or a communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets.

Chiplets also support the tight integration of IP blocks that can otherwise be difficult, such as those manufactured using different processing technologies or using different feature sizes (or utilizing different contact technologies or spacings). Thus, multiple ICs or IC assemblies, with different physical, electrical, or communication characteristics can be assembled in a modular manner to provide an assembly with various desired functionalities. Chiplet systems can also facilitate adaptation to suit needs of different larger systems into which the chiplet system will be incorporated. In an example, ICs or other assemblies can be optimized for the power, speed, or heat generation for a specific function—as can happen with sensors—can be integrated with other devices more easily than attempting to do so on a single die. Additionally, by reducing the overall size of the die, the yield for chiplets tends to be higher than that of more complex, single die devices.

FIG. 6A and FIG. 6B illustrate generally an example of a chiplet system, according to an embodiment. FIG. 6A is a representation of the chiplet system 602 mounted on a peripheral board 604, that can be connected to a broader computer system by a peripheral component interconnect express (PCIe), for example. The chiplet system 602 includes a package substrate 606, an interposer 608, and four chiplets, an application chiplet 610, a host interface chiplet 612, a memory controller chiplet 614, and a memory device chiplet 616. Other systems can include many additional chiplets to provide additional functionalities as will be apparent from the following discussion. The package of the chiplet system 602 is illustrated with a lid or cover 618, though other packaging techniques and structures for the chiplet system can be used. FIG. 6B is a block diagram labeling the components in the chiplet system for clarity.

The application chiplet 610 is illustrated as including a chiplet system NOC 620 to support a chiplet network 622 for inter-chiplet communications. In example embodiments the chiplet system NOC 620 can be included on the application chiplet 610. In an example, the first NOC 118 from the example of FIG. 1 can be defined in response to selected support chiplets (e.g., host interface chiplet 612, memory controller chiplet 614, and memory device chiplet 616) thus enabling a designer to select an appropriate number or chiplet network connections or switches for the chiplet system NOC 620. In an example, the chiplet system NOC 620 can be located on a separate chiplet, or within the interposer 608. In examples as discussed herein, the chiplet system NOC 620 implements a chiplet protocol interface (CPI) network.

In an example, the chiplet system 602 can include or comprise a portion of the first memory-compute node 104 or the first memory-compute device 112. That is, the various blocks or components of the first memory-compute device 112 can include chiplets that can be mounted on the peripheral board 604, the package substrate 606, and the interposer 608. The interface components of the first memory-compute device 112 can comprise, generally, the host interface chiplet 612, the memory and memory control-related components of the first memory-compute device 112 can comprise, generally, the memory controller chiplet 614, the various accelerator and processor components of the first memory-compute device 112 can comprise, generally, the application chiplet 610 or instances thereof, and so on.

The CPI interface, such as can be used for communication between or among chiplets in a system, is a packet-based network that supports virtual channels to enable a flexible and high-speed interaction between chiplets. CPI enables bridging from intra-chiplet networks to the chiplet network 622. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 622.

CPI can use a variety of different physical layers to transmit packets. The physical layer can include simple conductive connections, or can include drivers to increase the voltage, or otherwise facilitate transmitting the signals over longer distances. An example of one such a physical layer can include the Advanced Interface Bus (AIB), which in various examples, can be implemented in the interposer 608. AIB transmits and receives data using source synchronous data transfers with a forwarded clock. Packets are transferred across the AIB at single data rate (SDR) or dual data rate (DDR) with respect to the transmitted clock. Various channel widths are supported by AIB. The channel can be configured to have a symmetrical number of transmit (TX) and receive (RX) input/outputs (I/Os), or have a non-symmetrical number of transmitters and receivers (e.g., either all transmitters or all receivers). The channel can act as an AIB principal or subordinate depending on which chiplet provides the principal clock. AIB I/O cells support three clocking modes: asynchronous (i.e. non-clocked), SDR, and DDR. In various examples, the non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach, chiplet-to-chiplet interconnects, a parallel interface with clock rates that allow data transfer with minimal latency can be utilized. CPI includes elements to minimize both latency and energy consumption in these ultra-short reach chiplet interconnects.

For flow control, CPI employs a credit-based technique. A recipient, such as the application chiplet 610, provides a sender, such as the memory controller chiplet 614, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender allow transmitting of additional information.

The example of FIG. 6A incudes a chiplet mesh network 624 that uses a direct, chiplet-to-chiplet technique without a need for the chiplet system NOC 620. The chiplet mesh network 624 can be implemented in CPI, or another chiplet-to-chiplet protocol. The chiplet mesh network 624 generally enables a pipeline of chiplets where one chiplet serves as the interface to the pipeline while other chiplets in the pipeline interface only with themselves.

Additionally, dedicated device interfaces, such as one or more industry standard memory interfaces (such as, for example, synchronous memory interfaces, such as DDR5, DDR6), can be used to connect a device to a chiplet. Connection of a chiplet system or individual chiplets to external devices (such as a larger system can be through a desired interface (for example, a PCIe interface). Such an external interface can be implemented, in an example, through the host interface chiplet 612, which in the depicted example, provides a PCIe interface external to chiplet system. Such dedicated chiplet interfaces 626 are generally employed when a convention or standard in the industry has converged on such an interface. The illustrated example of a Double Data Rate (DDR) interface connecting the memory controller chiplet 614 to a dynamic random access memory (DRAM) memory device chiplet 616 is just such an industry convention.

Of the variety of possible support chiplets, the memory controller chiplet 614 is likely present in the chiplet system due to the near omnipresent use of storage for computer processing as well as sophisticated state-of-the-art for memory devices. Thus, using memory device chiplets 616 and memory controller chiplets 614 produced by others gives chiplet system designers access to robust products by sophisticated producers. Generally, the memory controller chiplet 614 provides a memory device-specific interface to read, write, or erase data. Often, the memory controller chiplet 614 can provide additional features, such as error detection, error correction, maintenance operations, or atomic operator execution. For some types of memory, maintenance operations tend to be specific to the memory device chiplet 616, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh can be controlled by a host processor or of a memory controller at some times, and at other times controlled by the DRAM memory device, or by logic associated with one or more DRAM devices, such as an interface chip (in an example, a buffer).

Atomic operators are a data manipulation that, for example, can be performed by the memory controller chiplet 614. In other chiplet systems, the atomic operators can be performed by other chiplets. For example, an atomic operator of "increment" can be specified in a command by the application chiplet 610, the command including a memory address and possibly an increment value. Upon receiving the command, the memory controller chiplet 614 retrieves a number from the specified memory address, increments the number by the amount specified in the command, and stores the result. Upon a successful completion, the memory controller chiplet 614 provides an indication of the command success to the application chiplet 610. Atomic operators avoid transmitting the data across the chiplet mesh network 624, resulting in lower latency execution of such commands.

Atomic operators can be classified as built-in atomics or programmable (e.g., custom) atomics. Built-in atomics are a finite set of operations that are immutably implemented in hardware. Programmable atomics are small programs that can execute on a programmable atomic unit (PAU) (e.g., a custom atomic unit (CAU)) of the memory controller chiplet 614.

The memory device chiplet 616 can be, or include any combination of, volatile memory devices or non-volatile memories. Examples of volatile memory devices include, but are not limited to, random access memory (RAM)—such as DRAM) synchronous DRAM (SDRAM), graphics double data rate type 6 SDRAM (GDDR6 SDRAM), among others. Examples of non-volatile memory devices include, but are not limited to, negative-and-(NAND)-type flash memory, storage class memory (e.g., phase-change memory or memristor based technologies), ferroelectric RAM (FeRAM), among others. The illustrated example includes the memory device chiplet 616 as a chiplet, however, the device can reside elsewhere, such as in a different package on the peripheral board 604. For many applications, multiple memory device chiplets can be provided. In an example, these memory device chiplets can each implement one or multiple storage technologies, and may include integrated compute hosts. In an example, a memory chiplet can include, multiple stacked memory die of different technologies, for example one or more static random access memory (SRAM) devices stacked or otherwise in communication with one or more dynamic random access memory (DRAM) devices. In an example, the memory controller chiplet 614 can serve to coordinate operations between multiple memory chiplets in the chiplet system 602, for example, to use one or more memory chiplets in one or more levels of cache storage, and to use one or more additional memory chiplets as main memory. The chiplet system 602 can include multiple memory controller chiplet 614 instances, as can be used to provide memory control functionality for separate hosts, processors, sensors, networks, etc. A chiplet architecture, such as in the illustrated system, offers advantages in allowing adaptation to different memory storage technologies; and different memory interfaces, through updated chiplet configurations, such as without requiring redesign of the remainder of the system structure.

Figure 7:
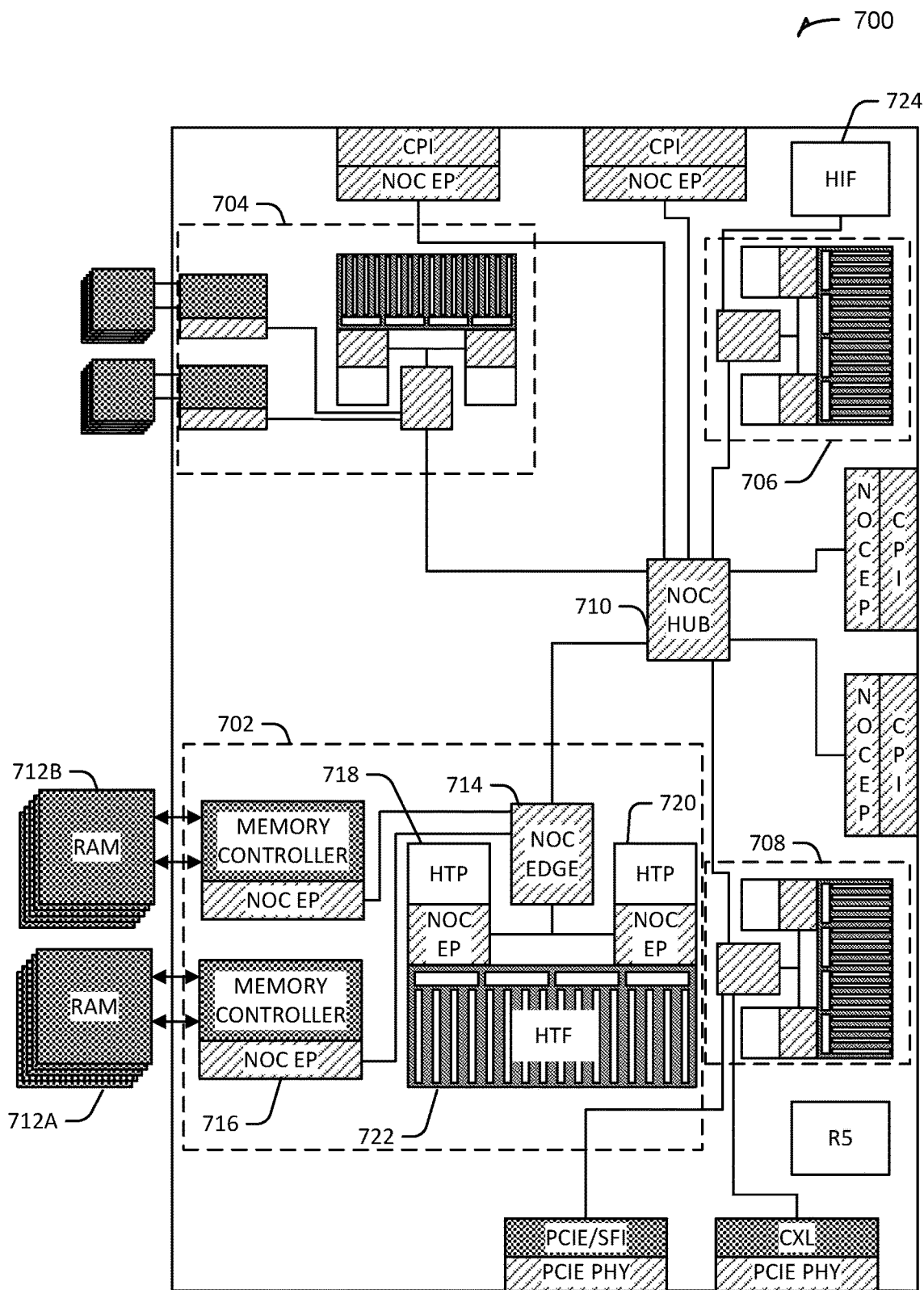
FIG. 7 illustrates generally an example of a chiplet-based implementation for a memory-compute device, according to an embodiment.

FIG. 7 illustrates generally an example of a chiplet-based implementation for a memory-compute device, according to an embodiment. The example includes an implementation with four compute-near-memory, or CNM, chiplets, and each of the CNM chiplets can include or comprise portions of the first memory-compute device 112 or the first memory-compute node 104 from the example of FIG. 1. The various portions can themselves include or comprise respective chiplets. The chiplet-based implementation can include or use CPI-based intra-system communications, as similarly discussed above in the example chiplet system 602 from FIG. 6A and FIG. 6B.

The example of FIG. 7 includes a first CNM package 700 comprising multiple chiplets. The first CNM package 700 includes a first chiplet 702, a second chiplet 704, a third chiplet 706, and a fourth chiplet 708 coupled to a CNM NOC hub 710. Each of the first through fourth chiplets can comprise instances of the same, or substantially the same, components or modules. For example, the chiplets can each include respective instances of an HTP accelerator, an HTF accelerator, and memory controllers for accessing internal or external memories.

In the example of FIG. 7, the first chiplet 702 includes a first NOC hub edge 714 coupled to the CNM NOC hub 710. The other chiplets in the first CNM package 700 similarly include NOC hub edges or endpoints. The switches in the NOC hub edges facilitate intra-chiplet, or intra-chiplet-system, communications via the CNM NOC hub 710.

The first chiplet 702 can further include one or multiple memory controllers 716. The memory controllers 716 can correspond to respective different NOC endpoint switches interfaced with the first NOC hub edge 714. In an example, the memory controller 716 comprises the memory controller chiplet 614 or comprises the memory controller 130, or comprises the memory subsystem 200, or other memory-compute implementation. The memory controllers 716 can be coupled to respective different memory devices, for example including a first external memory module 712a or a second external memory module 712b. The external memory modules can include, e.g., GDDR6 memories that can be selectively accessed by the respective different chiplets in the system.

The first chiplet 702 can further include a first HTP chiplet 718 and second HTP chiplet 720, such as coupled to the first NOC hub edge 714 via respective different NOC endpoint switches. The HTP chiplets can correspond to HTP accelerators, such as the HTP 140 from the example of FIG. 1, or the HTP accelerator 400 from the example of FIG. 4. The HTP chiplets can communicate with the HTF chiplet 722. The HTF chiplet 722 can correspond to an HTF accelerator, such as the HTF 142 from the example of FIG. 1, or the HTF 500 from the example of FIG. 5.

The CNM NOC hub 710 can be coupled to NOC hub instances in other chiplets or other CNM packages by way of various interfaces and switches. For example, the CNM NOC hub 710 can be coupled to a CPI interface by way of multiple different NOC endpoints on the first CNM package 700. Each of the multiple different NOC endpoints can be coupled, for example, to a different node outside of the first CNM package 700. In an example, the CNM NOC hub 710 can be coupled to other peripherals, nodes, or devices using CTCPI or other, non-CPI protocols. For example, the first CNM package 700 can include a PCIe scale fabric interface (PCIE/SFI) or a CXL interface (CXL) configured to interface the first CNM package 700 with other devices. In an example, devices to which the first CNM package 700 is coupled using the various CPI, PCIe, CXL, or other fabric, can make up a common global address space.

In the example of FIG. 7, the first CNM package 700 includes a host interface 724 (HIF) and a host processor (R5). The host interface 724 can correspond to, for example, the HIF 120 from the example of FIG. 1. The host processor, or R5, can correspond to the internal host processor 122 from the example of FIG. 1. The host interface 724 can include a PCI interface for coupling the first CNM package 700 to other external devices or systems. In an example, work can be initiated on the first CNM package 700, or a tile cluster within the first CNM package 700, by the host interface 724. For example, the host interface 724 can be configured to command individual HTF tile clusters, such as among the various chiplets in the first CNM package 700, into and out of power/clock gate modes.

Figure 8:
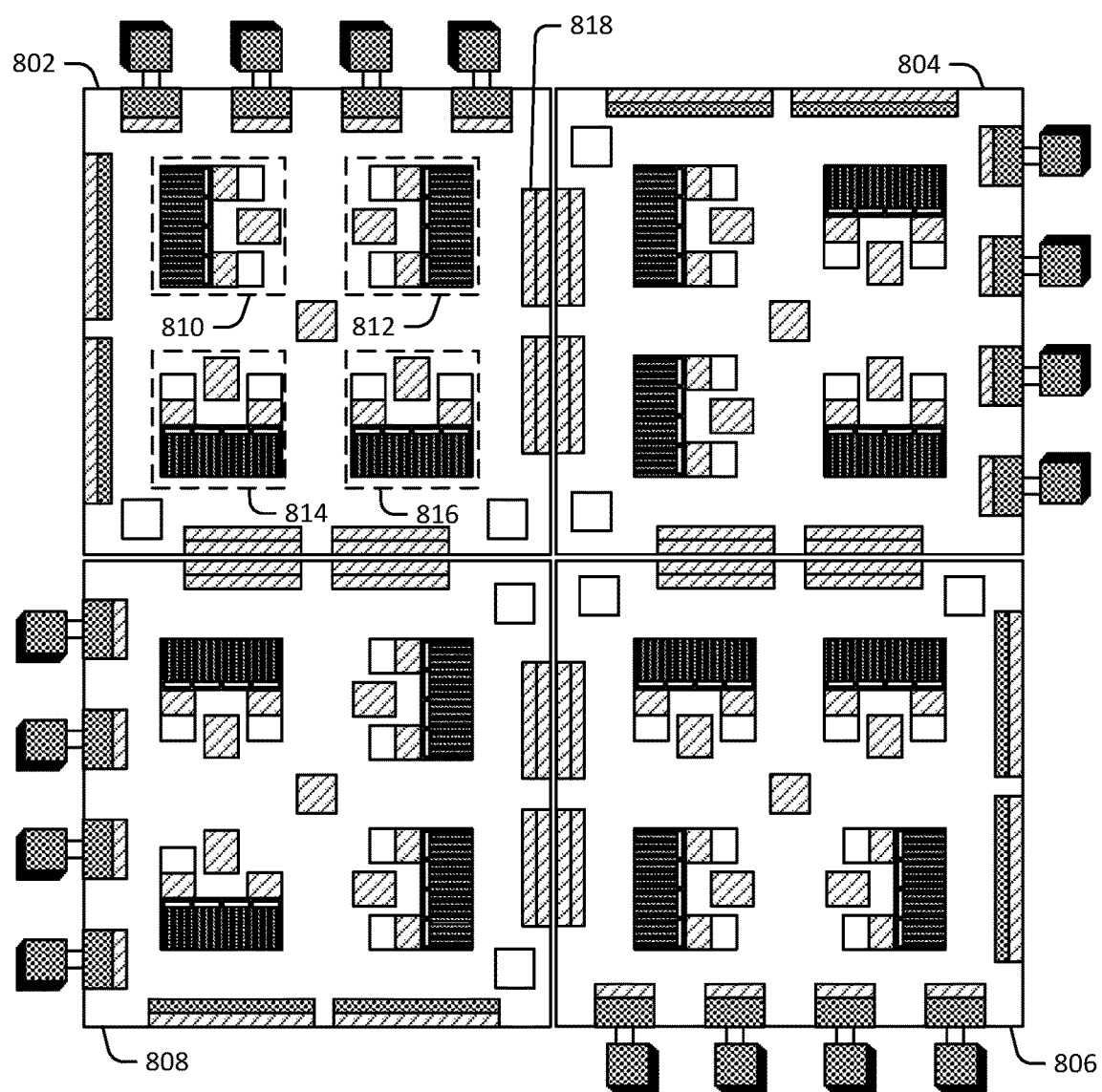
FIG. 8 illustrates an example tiling of memory-compute device chiplets, according to an embodiment.

FIG. 8 illustrates an example tiling of memory-compute devices, according to an embodiment. In FIG. 8, a tiled chiplet example 800 includes four instances of different compute-near-memory clusters of chiplets, where the clusters are coupled together. Each instance of a compute-near-memory chiplet can itself include one or more constituent chiplets (e.g., host processor chiplets, memory device chiplets, interface chiplets, and so on).

The tiled chiplet example 800 includes, as one or multiple of its compute-near-memory (CNM) clusters, instances of the first CNM package 700 from the example of FIG. 7. For example, the tiled chiplet example 800 can include a first CNM cluster 802 that includes a first chiplet 810 (e.g., corresponding to the first chiplet 702), a second chiplet 812 (e.g., corresponding to the second chiplet 704), a third chiplet 814 (e.g., corresponding to the third chiplet 706), and a fourth chiplet 816 (e.g., corresponding to the fourth chiplet 708). The chiplets in the first CNM cluster 802 can be coupled to a common NOC hub, which in turn can be coupled to a NOC hub in an adjacent cluster or clusters (e.g., in a second CNM cluster 804 or a fourth CNM cluster 808).

In the example of FIG. 8, the tiled chiplet example 800 includes the first CNM cluster 802, the second CNM cluster 804, a third CNM cluster 806, and the fourth CNM cluster 808. The various different CNM chiplets can be configured in a common address space such that the chiplets can allocate and share resources across the different tiles. In an example, the chiplets in the cluster can communicate with each other. For example, the first CNM cluster 802 can be communicatively coupled to the second CNM cluster 804 via an inter-chiplet CPI interface 818, and the first CNM cluster 802 can be communicatively coupled to the fourth CNM cluster 808 via another or the same CPI interface. The second CNM cluster 804 can be communicatively coupled to the third CNM cluster 806 via the same or other CPI interface, and so on.

In an example, one of the compute-near-memory chiplets in the tiled chiplet example 800 can include a host interface (e.g., corresponding to the host interface 724 from the example of FIG. 7) that is responsible for workload balancing across the tiled chiplet example 800. The host interface can facilitate access to host-based command request queues and response queues, such as from outside of the tiled chiplet example 800. The host interface can dispatch new threads of execution using hybrid threading processors and the hybrid threading fabric in one or more of the compute-near-memory chiplets in the tiled chiplet example 800.

Figure 9:
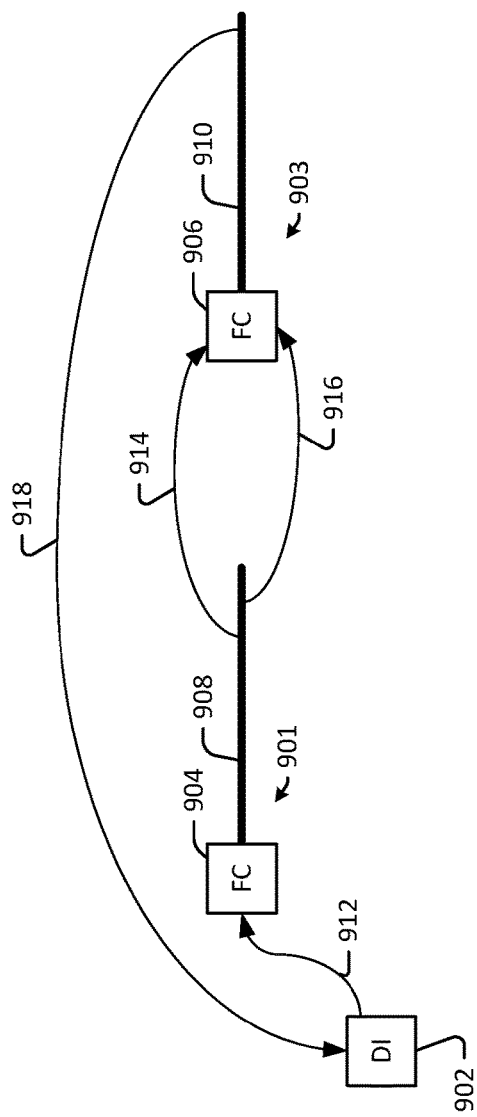
FIG. 9 is a diagram showing one example of a workflow for executing operations at a reconfigurable compute fabric using more than one synchronous flow.

FIG. 9 is a diagram showing one example of a workflow 900 for executing operations at a reconfigurable compute fabric, such as the HTF 142 or the HTF 500, using more than one synchronous flow. The workflow 900 of FIG. 9 utilizes a dispatch interface 902 and two synchronous flows 901, 903. The dispatch interface 902 is configured to receive instructions and/or data from other parts of a compute-near-memory system, as described herein. In some examples, the dispatch interface 902 is arranged in a manner similar to the dispatch interface 508 described herein.

The synchronous flows 901, 903 include respective flow controllers 904, 906 and compute elements arranged into ordered synchronous data paths 908, 910, as described herein. The synchronous data paths 908, 910, for example, may be between compute elements of the respective synchronous flows 901, 903, as described herein. The flow controllers 904, 906 and synchronous data paths 908, 910 are arranged from a reconfigurable compute fabric, such as the HTF 142 or the HTF 500 described herein.

The reconfigurable compute fabric may be arranged to implement the synchronous flows 901, 903 including flow controllers 904, 906 and various compute elements of the synchronous data paths 908, 910. For example, the flow controllers 904, 906 may be implemented using respective tile bases of the tiles 510, 512, etc. Synchronous data paths 908, 910 may be implemented between tiles 510, 512, etc., with the tiles 510, 512, etc. implementing the compute elements described herein. The tiles, tile bases, etc., as described herein and illustrated at FIG. 5 may be components of a hybrid threading fabric (HTF), such as the HTF 142, that is part of a memory-compute device, such as the memory-compute device 112 of FIG. 1. Other synchronous flows described herein may be similarly arranged using tiles and tile bases of HTFs as described herein.

In the workflow 900 of FIG. 9, the domain interface 902 initiates a processing task by providing an asynchronous message 912 to the flow controller 904 via the asynchronous fabric of the reconfigurable compute fabric. The asynchronous message 912 may be a continue-type message. The domain interface 902 may initiate the processing task based on its own programming and/or in response to an instruction from another component of the compute-near-memory system reconfigurable compute fabric. In some examples, the domain interface 902 also configures the reconfigurable compute fabric for the correct kernel configuration for executing the processing task including, for example, programming the various flow controllers 904, 906 and compute elements to implement the synchronous flows 901, 903.

The asynchronous message 912 may instruct the flow controller 904 to begin a synchronous flow thread. The flow controller may initiate the thread by providing a first synchronous message to a first compute element of the synchronous data path 908, for example, when the spoke RAM selects the flow controller 904 for the synchronous data path 908 between components of the synchronous flow 901. The synchronous message may include data and control information, as described herein. The first compute element of the synchronous data path 908 begins execution of the thread by performing a processing task and generating a next synchronous message that is sent to a second compute element of the synchronous data path 908. The second compute element performs a processing task and generates a third synchronous message that is sent to a third compute element of the synchronous data path 908, and so on until the thread is executed at all of the compute elements of the synchronous data path 908.

The compute elements of the synchronous data path 908 are programmed to perform various operations while executing a thread including, for example, operations for configuring the synchronous flow 903. For example, during execution of a thread at the synchronous flow 901, one or more of the compute elements of the synchronous data path 908 send an asynchronous message 914 to the flow controller 906 of the synchronous flow 903. The asynchronous message 914 instructs the flow controller 906 to initiate a thread at the synchronous flow 903 conditioned upon the occurrence of at least one condition. In this example, the condition or conditions include the receipt of another asynchronous message from the synchronous flow 901 indicating that the thread is complete or that it is otherwise acceptable to initiate a thread at the synchronous flow 903. Later in the execution of the thread at the synchronous flow 901, a compute element of the synchronous data path 908 sends an asynchronous message 916 to the flow controller 906 of the synchronous flow 903. The asynchronous message 916 indicates that the thread at the synchronous flow 901 has completed and/or reached a point where a corresponding thread at the synchronous flow 903 may begin. In some examples, the asynchronous message 916 indicates a result of the processing performed during the thread at the synchronous flow 903.

Upon receiving the asynchronous message 916 (and when other conditions, if any, of the asynchronous message 914 are met), the flow controller 906 initiates a thread at the synchronous flow 903, for example, by sending a first synchronous message to a first compute element of the synchronous data path 910. In some examples, e.g., upon completion of the thread at the synchronous flow 903, a compute element of the synchronous data path 910 will send an asynchronous message 918 to the dispatch interface 902 to indicate that the requested processing task has been completed.

Figure 10:
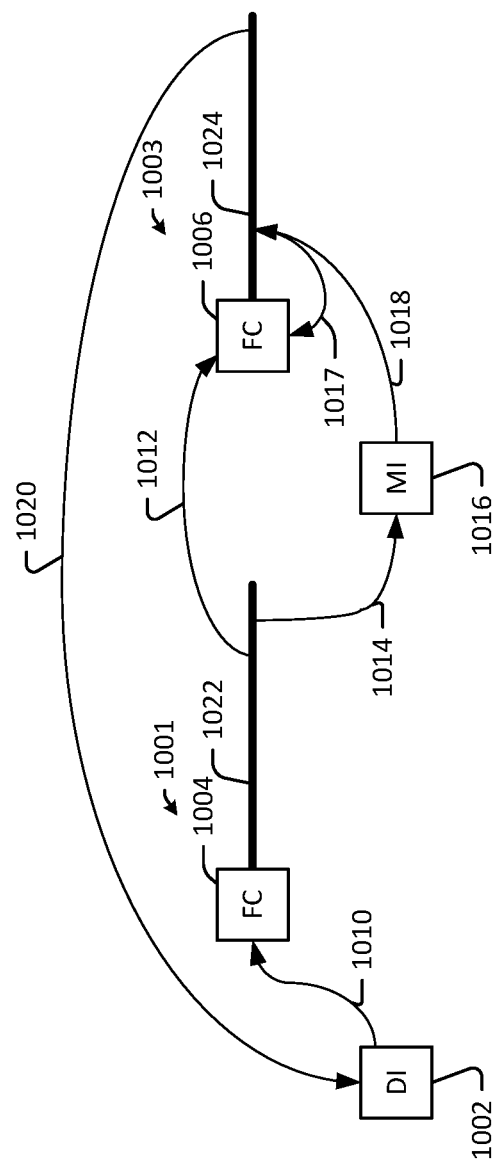
FIG. 10 is a diagram showing one example of a workflow for executing operations at a reconfigurable compute fabric in which synchronous flows interact with a memory interface.

FIG. 10 is a diagram showing one example of a workflow 1000 for executing operations at a reconfigurable compute fabric, such as the HTF 142 or the HTF 500, in which synchronous flows 1001, 1003 interact with a memory interface 1016. In the workflow 1000, the domain interface 1002 initiates a processing task by providing an asynchronous message 1010 to the flow controller 1004 via the asynchronous fabric of the reconfigurable computing fabric. The asynchronous message 1010 instructs the flow controller 1004 to initiate a thread at the synchronous flow 1001 upon the occurrence of one or more conditions. (In some examples, the message 1010 may instruct the flow controller 1004 to begin execution of the thread immediately without waiting for the occurrence of any conditions).

The flow controller 1004 initiates the thread by providing a synchronous message to the first compute element of a synchronous data path 1022, as described herein. During the execution of the thread at the synchronous flow 1001, a compute element of the synchronous data path 1022 provides an asynchronous message 1012 to the flow controller 1006 of the synchronous flow 1003. The asynchronous message 1012 may indicate that the flow controller 1006 is to initiate a thread at the synchronous flow 1003 upon receiving an indication that data from the memory interface 1016 has been received.

As part of the execution of the thread at the synchronous flow 1001, another compute element of the synchronous data path 1022 provides an asynchronous message 1014 to the memory interface 1016. The asynchronous message 1014 comprises a read request to be directed to memory of the compute-near-memory system such as, for example, a memory element of a memory-compute device including the reconfigurable compute fabric. In some examples, the asynchronous message 1014 may also identify a compute element of the synchronous flow 1003 that is to receive the result of the read request.

The memory interface 1016 executes the read request at the appropriate external memory to obtain load data. When the load data is received, the memory interface 1016 directs an asynchronous message 1018 including the load data to the compute element of the synchronous flow 1003 indicated by the asynchronous message 1014 (e.g., one of the compute elements of the synchronous data path 1024). Upon receiving the load data, the compute element writes the load data to compute element memory and sends an asynchronous message 1017 to the flow controller 1006 of the synchronous flow 1003. The message 1017 indicates that the load data has been received. In some examples, the memory interface 1016 provides asynchronous messages including the load data, similar to the message 1018, to multiple compute elements of the synchronous flow 1003. Each compute element that has received the load data may provide a corresponding asynchronous message to the flow controller 1006, similar to the message 1017.

Upon receiving the asynchronous message 1017 (and after any other conditions of the continue-type message 1012 are met), the flow controller 1006 initiates a thread at the synchronous flow 1003, for example, by providing a synchronous message to the first compute element of a synchronous data path 1024. If more than one compute element of the synchronous flow 1003 was to receive the load data, then flow controller 1006 may initiate the thread when it has received all of the expected asynchronous messages from compute elements having received the load data. In some examples, upon completion of the thread at the synchronous flow 1003, one or more of the compute elements of the synchronous data path 1024 (e.g., the last compute element thereof) sends an asynchronous message 1020 indicating completion to the dispatch interface 1002.

Figure 11:
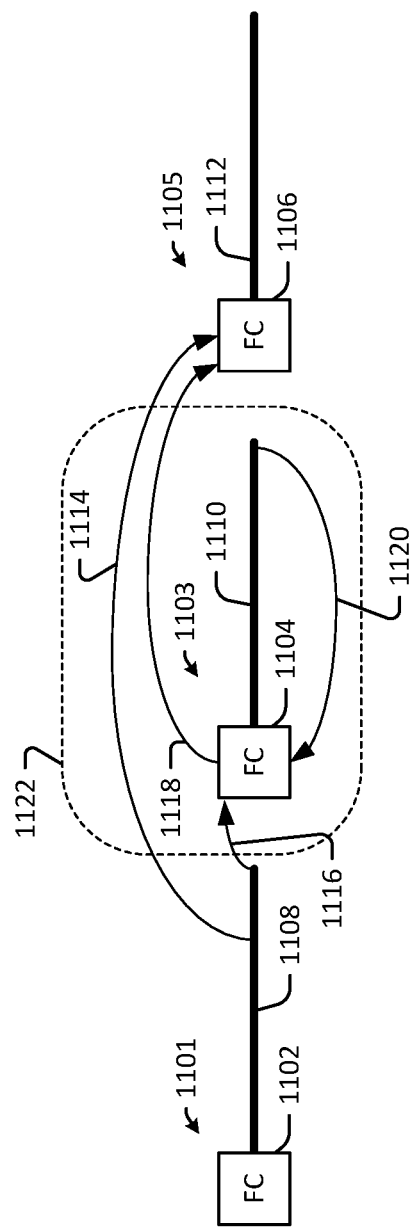
FIG. 11 is a diagram showing one example of a workflow for executing a loop using a reconfigurable compute fabric.

FIG. 11 is a diagram showing one example of a workflow 1100 for executing a loop 1122 using a reconfigurable compute fabric, such as the HTF 142 or the HTF 500. The workflow 1100 is illustrated using three synchronous flows 1101, 1103, 1105. In this example, each iteration of the loop 1122 is executing using a single thread at a single synchronous flow 1103. In this examples, threads of the synchronous flow 1101 and the synchronous flow 1105 may execute threads having a common thread ID. Threads at the synchronous flow 1103 may have different thread IDs that may be at a lower level thread ID. For example, if the threads of the synchronous flows 1101 and 1105 are at a level T1, the threads of the synchronous flow 1103 may be at a level T0.

A flow controller 1102 initiates a first thread at the synchronous flow 1101, for example, by providing a synchronous message to a first compute element of a synchronous data path 1108. Execution of the thread at the synchronous flow 1101 includes sending an asynchronous message 1114 to the flow controller 1106 of the synchronous flow 1105. The asynchronous message 1114 may be a continue-type message indicating that the flow controller 1106 is to execute a thread at the synchronous flow 1105 after receiving an indication that the loop 1122 has completed. In some examples, the asynchronous message 1114 also indicates the thread ID of the thread executing at the synchronous flow 1101 so that the corresponding thread at the synchronous flow 1105 may use the same thread ID (and associated resources). Execution of the thread at the synchronous flow 1101 also includes sending an asynchronous message 1116 to the flow controller 1104 of the synchronous flow 1103. The asynchronous message 1116 may be a loop-type message instructing the flow controller 1104 to execute a loop. For example, the asynchronous message 1116 may include an iteration count indicating the number of iterations in the loop.

The flow controller 1104 initiates a thread for the first iteration of the loop. In some examples, the flow controller 1104 generates an iteration index, as described herein. The iteration index may be included, for example, with control information propagated through the synchronous flow via the synchronous messages. The compute elements of a synchronous data path 1110 of the synchronous domain 1103 execute the first iteration of the loop. The compute elements of a synchronous data path 1110 may use the iteration index generated by the flow controller 1104. When the thread is completed, one or more compute elements sends an asynchronous message 1120 to the flow controller 1104 indicating that the first iteration of the loop has completed. Asynchronous messages generated by synchronous flow 1103 such as message 1118 may carry the iteration index for the loop 1122.

In some examples, the flow controller 1104, after initiating the first thread for the first iteration of the loop, continues to initiate additional threads for executing additional iterations of the loop. For example, if the flow controller 1104 has a Spoke Count of three, it may initiate a new thread at the synchronous flow 1103 for a new iteration of the loop every three clock cycles. This may occur without regard for whether the thread for the previous loop iteration has completed propagating through the compute elements of the synchronous data path 1110. In some examples, the various threads implementing different loop iterations can execute at the compute elements of the synchronous data path 1110 of the synchronous flow 1103 concurrently (e.g., offset by the Spoke Count).

When threads implementing all iterations of the loop 1122 have completed, the flow controller 1104 will have received asynchronous messages originating from all of the threads implementing the iterations. When this has occurred, the flow controller 1104 sends an asynchronous message 1118 to the flow controller 1106 indicating that the loop 1122 has completed. The flow controller 1106 may respond by initiating a thread at the compute elements 1112 to implement a next portion of the programming of the reconfigurable compute fabric.

FIG. 11 shows various example elements that can be combined to implement loops in different contexts. First, although the example of FIG. 11 shows the loop 1122 being initiated by a thread at the synchronous flow 1101, in some examples, a loop can be initiated by another component, such as a dispatch interface. Also, although in the example of FIG. 11 the completion of the loop 1122 triggers another thread at another synchronous flow 1105, in some examples, the completion of a loop may indicate the completion of a processing task. Accordingly, the synchronous message 1118 indicating the completion of a loop may be provided to the dispatch interface in addition to or instead of being provided to another flow controller 1106 as shown in FIG. 11.

Also, FIG. 11 illustrates elements that can be used to implement a nested loop. For example, the thread at the synchronous flow 1101 that initiates the loop 1122 may be executing an iteration of an outer loop that calls the loop 1122 as an inner loop. Also, in some examples, each thread at the synchronous flow 1103 implementing an iteration of the loop 1122 may cause another synchronous flow (not shown) to implement another loop, for example, as threads at the synchronous flow 1101 cause the synchronous flow 1103 to execute the loop 1122.

In the example of FIG. 11, each iteration of the loop 1122 is executed using a single synchronous flow 1103. In some examples, however, execution of a loop iteration may utilize multiple synchronous flows. For example, executing a thread for an iteration of the loop 1122 may include sending an asynchronous message to a second flow controller and/or to a memory interface. The second flow controller initiates a thread at another synchronous flow (not shown) to execute another portion of the loop iteration. In this example, upon completion of a loop iteration, the synchronous flow that completes a loop iteration sends an asynchronous message to the flow controller that initiated the loop (e.g., flow controller 1104).

In some examples, the arrangement of FIG. 11 may be modified such that the loop-type asynchronous message 1116 and the continue-type asynchronous message 1114 are sent by the flow controller 1102 instead of by a compute element of the synchronous flow 1101, as shown in FIG. 11. This may reduce the number compute elements used at the synchronous data path 1108. In some examples, it may permit compute elements for the synchronous flow 1101 to be omitted.

Figure 12:
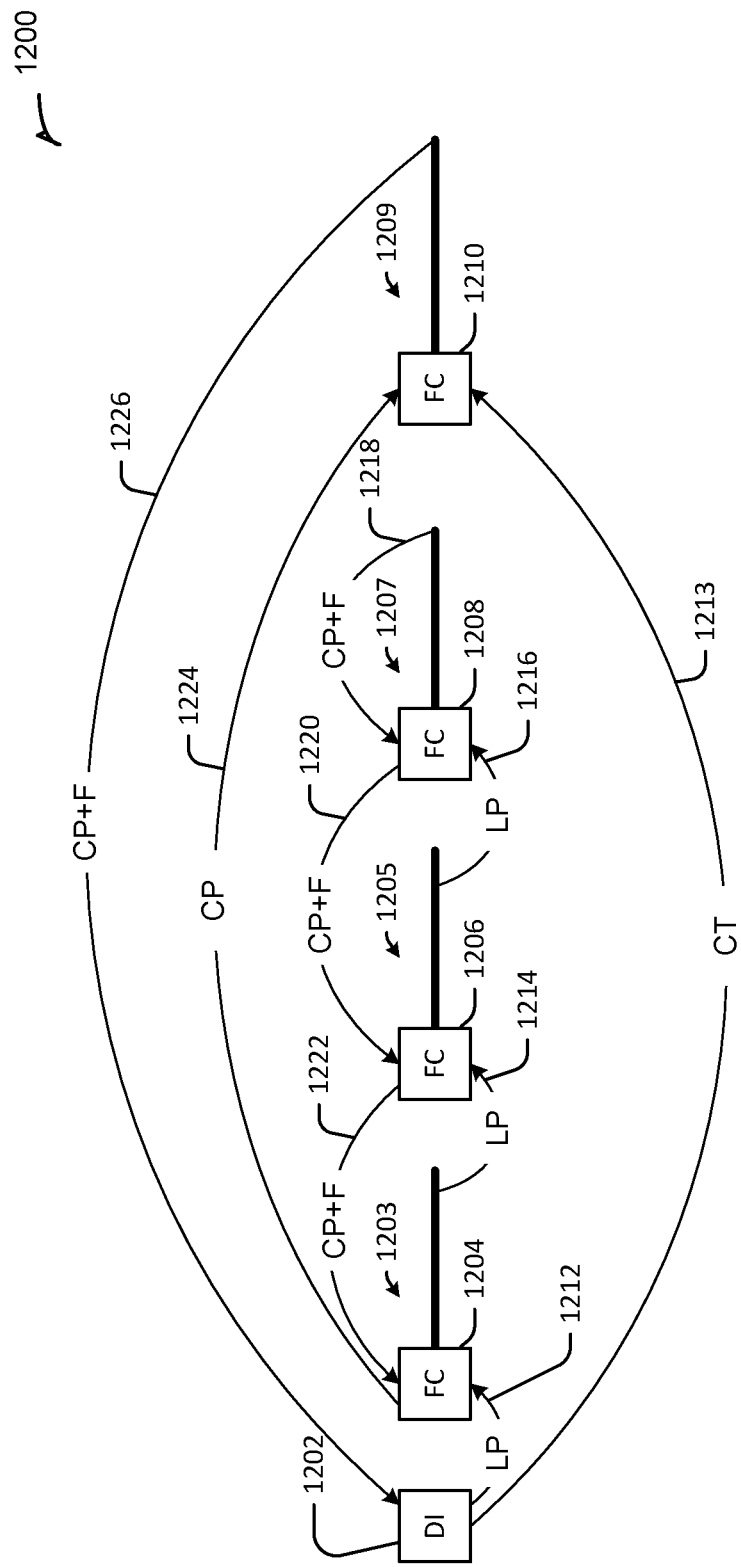
FIG. 12 is a diagram showing one example of a workflow for executing a triply-nested loop using a reconfigurable compute fabric.

FIG. 12 is a diagram showing an example of a workflow 1200 for executing a triply-nested loop using a reconfigurable compute fabric, such as the HTF 142 or the HTF 500. The workflow 1200 is illustrated using a dispatch interface 1202 and four synchronous flows 1203, 1205, 1207, and 1209. The workflow 1200 of FIG. 12 may be used to execute code segment [4] below:

```
for x=1, L {
  for y=1, M {
    for z=1, N{
      s+=x*y+z
    }
  }
}
saveMem = s;
```
[4]

In the example of FIG. 12, the reconfigurable compute fabric is configured to include three thread levels, T2, T1, and T0. In the example of FIG. 12, however, the dispatch interface 1202 is configured to directly send a loop-type asynchronous message 1212 to the flow controller 1204. This may allow the dispatch interface 1202 to effectively operate as an additional thread level, which is referred to herein as thread level T3, with one available thread ID. The asynchronous message 1212 may indicate the number of iterations of the first-level x loop (in this example, L iterations).

The flow controller 1204 responds to the loop-type asynchronous message 1212 by initiating threads at the synchronous flow 1203 for executing iterations of the first-level x loop. For example the flow controller 1204 may generate an iteration index value for each thread initiated at the synchronous flow 1203 and provide the iteration index to the compute elements of the synchronous flow 1203 via synchronous messages, as described herein. The threads initiated at the synchronous flow 1203 may be assigned T2 level thread IDs. Each thread at the synchronous flow 1203 may send an asynchronous message 1214 to the flow controller 1206. The asynchronous message 1214 may be a loop-type message instructing the flow controller 1206 to begin initiating threads at the synchronous flow 1205 for executing iterations of the second-level y loop. The asynchronous message 1214 may indicate the number of iterations of the second-level y loop (in this example, M iterations).

The flow controller 1206 may determine respective iteration indices for each initiated thread and initiate the threads at the synchronous flow 1205, for example, by sending one or more synchronous messages, as described herein. The threads initiated at the synchronous flow 1205 may be assigned T1 level thread IDs. Each thread at the synchronous flow 1205 may send an asynchronous message 1216 to the flow controller 1208. The asynchronous message 1216 may be a loop-type message instructing the flow controller 1208 to begin initiating threads at the synchronous flow 1207 for executing iterations of the third-level z loop. The asynchronous message 1216 may indicate the number of iterations of the third-level z loop (in this example, N iterations).

The flow controller 1208 may determine respective iteration indices for each initiated thread and initiate the threads at the synchronous flow 1207, for example, by sending one or more synchronous messages, as described herein. The threads initiated at the synchronous flow 1207 may be assigned T0 level thread IDs. Threads at the synchronous flow 1207 may, for example, update the accumulation value s, for example, by writing the iteration-specific value for s to a compute element memory location indicated by the iteration index. Threads at the synchronous flow 1207 may also, when complete, send an asynchronous message 1218 to the flow controller 1208. The asynchronous message 1218 may be a complete and free type message indicating that the thread at the synchronous flow 1207 is complete and that the T0 thread ID (and associated resources) used by the completed thread are now available for reassignment to another synchronous flow thread.

When the flow controller 1208 initiates N threads and receives N instances of the asynchronous message 1218, it may determine that an instance of the third-level z loop has completed (e.g., N iterations of the third-level z loop have completed). The flow controller 1208 sends an asynchronous message 1220 to the flow controller 1206 indicating that the instance of the third-level z loop requested by a particular loop asynchronous message 1216 has completed and that the T1 level thread ID of the thread at the synchronous flow 1205 that sent the loop asynchronous message 1216 is now free. Because the asynchronous message 1220 is sent by the flow controller 1208, it may not be necessary to include an additional synchronous flow to conclude the z loop, for example, as in the example of FIG. 12.

The flow controller 1206 may initiate threads for each of the M iterations of the second-level y loop and each of those threads may send an asynchronous message 1216 initiating an instance of the third-level z loop. Accordingly, the flow controller 1206 may, eventually, receive N instances of the asynchronous message 1220. Upon receiving M instances of the asynchronous message 1220, the flow controller 1206 may determine that all iterations of one instance of the second-level y loop have executed. In response, the flow controller 1206 sends an asynchronous message 1222 to the flow controller 1204. The asynchronous message 1222 may be a complete and free type message indicating that an instance of the second-level y loop is complete and that the T2 level thread ID of the thread at the synchronous flow 1203 that requested it is now free.

The flow controller 1208 may initiate threads for each of the L iterations of the first-level x loop and each of those threads may send an asynchronous message 1214 initiating an instance of the second-level y loop. Accordingly, the flow controller 1206 may, eventually, receive L instances of the asynchronous message 1222. Upon receiving L instances of the asynchronous message 1222, the flow controller 1208 may determine that all iterations of the first-level x loop have executed. In response, the flow controller 1208 sends an asynchronous message 1224 to the flow controller 1204. The asynchronous message 1222 may be a complete type message indicating that the triply-nested loop is complete. In response to the asynchronous message 1224 and the previously continue-type asynchronous message 1213 from the dispatch interface 1202, the flow controller 1210 initiates a thread at the synchronous flow 1209 to perform the save of the accumulation value s. Upon completion, the thread at the synchronous flow 1209 sends an asynchronous message 1226 to the dispatch interface 1202. The asynchronous message 1226 may be a complete and free type message indicating that the code segment [5] is complete and that the (single) T3 level thread ID is available.

Figure 13:
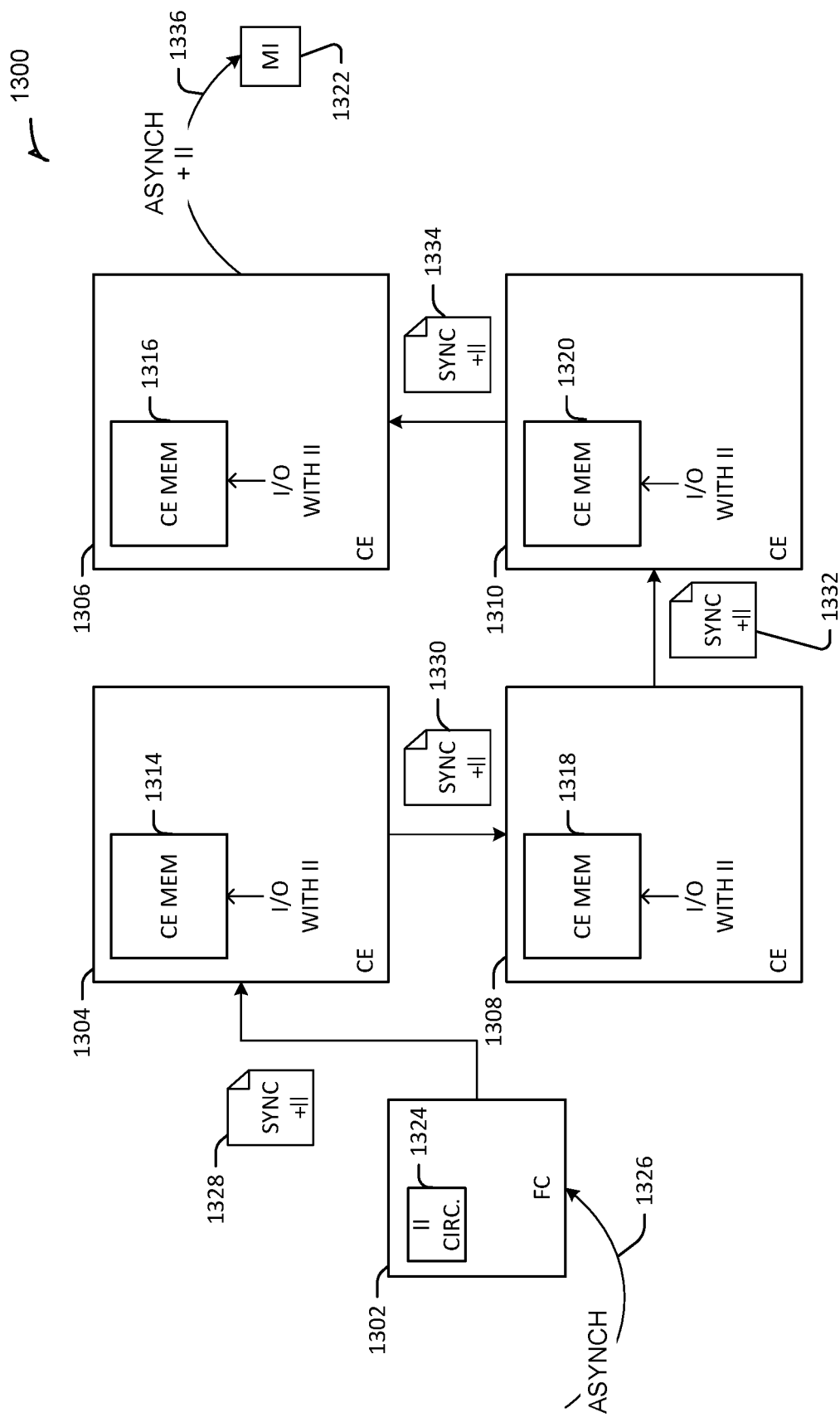
FIG. 13 is a diagram showing one example of a synchronous flow arranged with a flow controller configured to generate an iteration index.

FIG. 13 is a diagram showing one example of a synchronous flow 1300 arranged with a flow controller 1302 configured to generate an iteration index. The synchronous flow 1300 may be arranged from a reconfigurable compute fabric such as the HTF 142 or the HTF 500 described herein. The example synchronous flow 1300 of FIG. 13 includes a flow controller 1302 and example compute elements 1304, 1306, 1308, 1310. One or more tiles, tile bases, or other components of the reconfigurable compute fabric may be programmed to implement the flow controller 1302 and various tiles (or portions thereof) may be configured to implement the respective compute elements 1304, 1306, 1308, 1310.

The synchronous flow 1300 of FIG. 13 shows an example synchronous data path that passes synchronous messages 1328, 1330, 1332, 1334 between the components from the flow controller 1302 to the compute element 1304; from the compute element 1304 to the compute element 1308; from the compute element 1308 to the compute element 1310; and from the compute element 1310 to the compute element 1306.

The flow controller 1302 may receive an asynchronous message 1326 instructing the flow controller 1302 to execute a loop using the using the synchronous flow 1300. The asynchronous message 1326 may include, for example, an iteration count of the loop to be executed using the synchronous flow 1300. If the loop to be executed by the synchronous flow 1300 is a second-level or lower level loop of a nested loop, the asynchronous message 1326 may also include information about the one or more higher-level loops including, for example, iteration count for the higher-level loops, the iteration number of the higher-level loop iteration that sent the asynchronous message 1326, etc. An iteration count is the total number of iterations of a loop to be executed. For example, a loop executed for values of x between 1 and 2048 has a loop count of 2048. An iteration number is the number of a particular iteration being executed.

Referring again to the example code segment [4] above, if the asynchronous message 1326 is instructing the flow controller 1302 to implement the third-level z loop, it may include the iteration number from the first-level x loop and the iteration number of the second-level y loop that are associated with the called execution of the third-level z loop. In some examples, as described herein, the asynchronous message 1326 may also include the iteration count of the first-level x loop and/or of the second-level y loop.

The flow controller 1302 may implement the loop instructed by the asynchronous message 1326 by beginning to initiate synchronous flow threads at the synchronous flow 1300. The synchronous flow threads correspond to different iterations of the requested loop. The flow controller 1302 initiates a synchronous flow thread by sending a synchronous message 1328 to the first compute element 1304 of the synchronous flow 1300. The flow controller 1302 may include an iteration index circuit 1324 that generates an iteration index for each iteration of the loop. The iteration index generated by the iteration index circuit 1324 is provided to first compute element 1304 of the synchronous flow 1300 as part of the synchronous message 1328. The iteration index may be included, for example, with the control information.

The iteration index circuit 1324 may determine an iteration index in any suitable manner. In some examples, the iteration index circuit 1324 generates an iteration index using iteration numbers and/or iteration count of the loop being executed at the synchronous flow 1300 and/or the iteration number and/or iteration count of one or more higher level loops. Consider an example where there is one higher-level loop, referred to in this example as an outer loop with the loop being incremented by the synchronous flow 1300 being referred to as an inner loop. The iteration index circuit 1324 may perform a first operation on iteration number of the higher level loop and combine the result with the inner loop iteration number.

In some examples, the operation on the outer loop iteration number includes applying an outer loop binary mask to the outer loop iteration number. This may return a masked outer loop iteration number. In other examples, the operation on the outer loop iteration number includes multiplying the outer loop iteration number by a constant to generate an outer loop iteration number product. The results of the operation on the outer loop iteration number may be combined with the masked outer loop iteration number, for example, by addition, Boolean "or" or any other suitable function. If there is more than one outer loop (e.g., if the loop executed at the synchronous flow 1300 is a third or lower-level loop), the iteration index may consider iteration numbers and/or iteration counts of more than one or of all of the outer loops.

In some examples, applying the operation to the outer loop iteration number limits the outer loop iteration number to indications of outer loop iterations associated with the synchronous flow 1300. Consider the example of code segment [3] above in which N is equal to 2048. Here a first-level outer loop for x executes 2048 times and the second-level inner loop for y also executes 2048 times, meaning that the inner loop executes 16,777,216 iterations in total. Compute elements of the synchronous flow 1300 may not have sufficient compute element memory to store data for all 16,777,216 iterations. Accordingly, multiple synchronous flows may be used to execute the inner loop and/or a compute element memories are written to external memory and cleared after a predetermined number of iterations. Masking and/or multiplying the outer loop iteration number, accordingly, may limit the resulting masked outer loop iteration number to indicate iterations of the outer loop that are to be executed at the synchronous flow 1300.

In some examples, the iteration index circuit 1324 generates a unique iteration index for each iteration of the loop to be executed by the executed by the synchronous flow 1300, for example, from the outer loop iteration number and unique inner loop iteration number. In other examples, the iteration circuit 1324 generates an initial iteration index for a first iteration of the loop to be executed by the synchronous flow 1300. The iteration index circuit 1324 adds margins to the initial iteration index for subsequent iterations of the loop. The margin may reflect the amount space at the respective compute element memories that may be used by the compute elements on each iteration. In some examples, the margin is or is based on the data width of the compute elements 1304, 1306, 1308, 1310. For example, each compute element 1304, 1306, 1308, 1310 may process a predetermined amount of data in each operation. The iteration index circuit 1324 find the iteration index for one loop iteration by adding the data width (or a multiple of the data width) to the iteration index for the previous iteration.

As described, the iteration index generated by the iteration index circuit 1324 for a given synchronous flow thread corresponds to the loop iteration to be implemented by that thread. The flow controller 1302 includes the iteration index in the synchronous message 1328 sent to the compute element 1304 to initiate the synchronous flow 1300. The compute element 1304 uses the iteration index to perform an I/O operation. In the example of FIG. 13, the compute element 1304 uses the iteration index to perform one or more I/O operations at the compute element memory 1314 of the compute element 1304. For example, the compute element 1304 may read operand data from the compute element memory and/or write result data to the compute element memory 1314 at a memory location indicated by the iteration index. For example, the compute element 1304 may read data from and/or write data to a memory location that is offset from a base memory location by an amount equal to the iteration index. In some examples, the iteration index is used relative to different base memory locations for different operations. For example, the compute element 1304 may read operand data from a memory location that is offset from a first base location by the iteration index amount and write result data to another memory location that is offset from a second base location by the iteration index amount.

The compute element 1304 may pass the iteration index generated by the iteration index circuit 1324 to the next compute element 1308 via the synchronous message 1330. In this way, the iteration index may continue to be passed between compute elements 1306, 1308, 1310, that are part of the same synchronous flow thread. The compute elements 1308, 1310, 1306 may use the iteration index, for example, for I/O operations to the respective compute element memories 1318, 1320, 1316.

In some examples, one or more compute elements 1304, 1306, 1308, 1310 may use the iteration index to reference an external memory location. In the example of FIG. 13, the compute element 1306 sends an asynchronous message 1336 to a memory interface 1322. The asynchronous message 1336 may includes the iteration index and uses the iteration index to refer to one or more memory locations at the external memory that correspond to the iteration of the executing thread. For example, the asynchronous message 1336 may include a write message including data to be written and using the iteration index to refer to a memory location for storing the data. In other examples, the asynchronous message 1336 may include a read request in addition to or instead of a write request. The read request may request data stored to the external memory at a memory location indicated by the iteration index.

Figure 14:
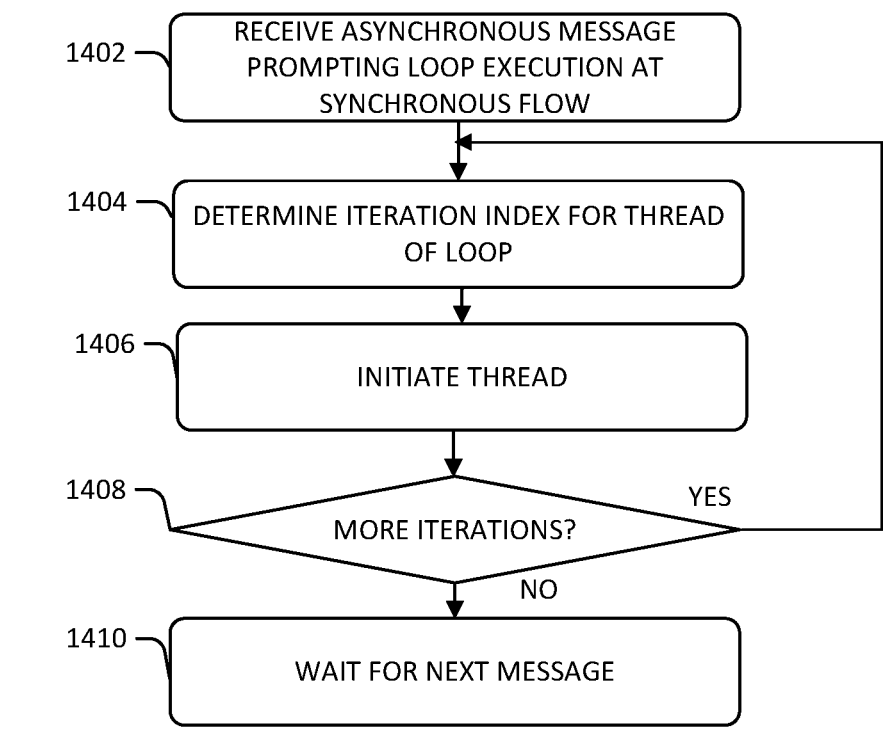
FIG. 14 is flowchart showing one example of a process flow that may be executed by a flow controller to execute a loop at a synchronous flow using an iteration index.

FIG. 14 is flowchart showing one example of a process flow 1400 that may be executed by a flow controller to execute a loop at a synchronous flow using an iteration index. The flow controller executing the process flow 1400 is associated with and initiates threads at a synchronous flow, as described herein. At operation 1402, the flow controller receives an asynchronous message instructing the flow controller to execute a loop at the synchronous flow. The asynchronous message includes an iteration count for the loop.

At operation 1404, the flow controller determines an iteration index for a synchronous flow thread to execute a first iteration of the loop. This can include, for example, performing an operation on the iteration number of one or more associated outer loops and combining the result with the iteration number of the requested loop, as described herein. At operation 1406, the flow controller initiates a thread at the synchronous flow, for example, by directing a synchronous message to a first compute element of the synchronous flow.

At operation 1408, the flow controller determines if there are more iterations of the requested loop to be executed. If yes, the flow controller, at operation 1404, generates an iteration index for the next iteration of the loop. This can include performing an operation on the outer loop iteration count and combining the result with the inner loop iteration number, as indicated above. In other examples, determining the iteration index for the next iteration at operation 1404 includes adding a margin value to the iteration index for the previous iteration. When a thread ID for a new synchronous flow thread is available and, for example, at the appropriate spoke count, the flow controller initiates a next thread at the synchronous flow to execute the next iteration at operation

1406. If, at operation 1408, there are no more iterations of the loop to be executed, the flow controller waits for its next message at operation 1410.

Figure 15:
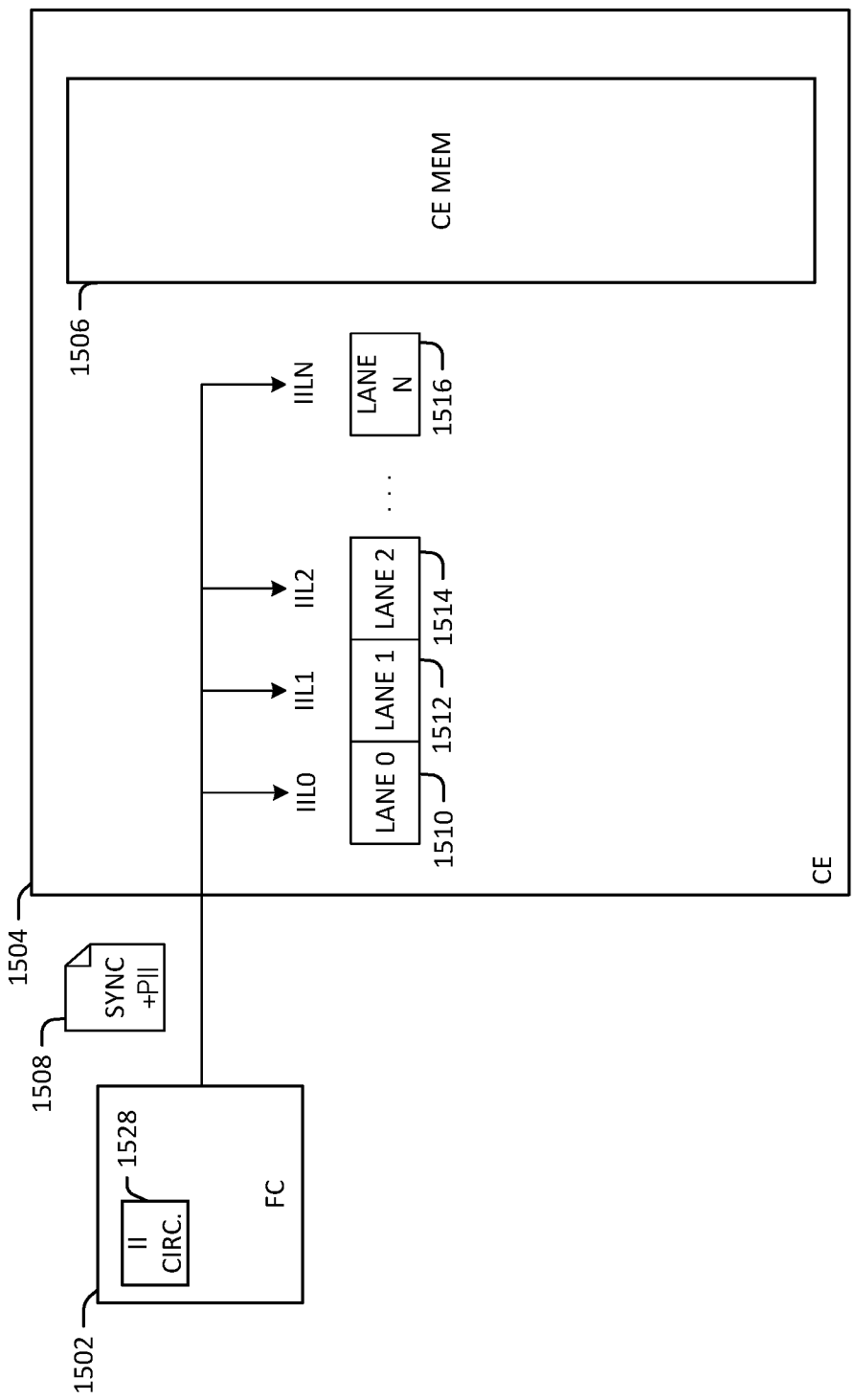
FIG. 15 is a diagram showing one example of a flow controller and compute element of a synchronous flow utilizing a packed iteration index.

FIG. 15 is a diagram showing one example of a flow controller and compute element of a synchronous flow utilizing a packed iteration index. In some examples, the tiles or other compute elements of a reconfigurable compute fabric each comprise multiple parallel processing lanes, such as SIMD processing lanes. FIG. 15 shows an example including a flow controller 1502 with an iteration index circuit 1528 to generate iteration indices, as described herein. The flow controller 1502 generates a packed iteration index and provides the packed iteration index to the example compute element 1504 via a synchronous message 1508.

The compute element 1504 comprises parallel processing lanes 1510, 1512, 1514, 1516. N parallel processing lanes are shown, where N may be any suitable number including, for example, 8. Also, the width of the parallel processing lanes may be of any suitable value. In some examples, there are 8 processing lanes of 64 bit with, for a total data path width of 512 bits. Other numbers of processing lanes and processing lane widths can also be used. In this example, each parallel processing lane uses a different iteration index IIL0, IIL1, IIL2, IILN. Each lane-specific iteration index may be offset by the data width of the various lanes. For example, if the parallel processing lanes have a data width of 8 bits, each lane-specific iteration index may be offset from the iteration index of the preceding lane by 8 bits.

The iteration index circuit 1528 of the flow controller 1502 may be configured to generate a packed iteration index. The packed iteration index includes lane-specific iteration indices for more than one parallel processing lane packed into a single value. For example, the iteration index circuit 1528 may generate a first iteration index for a first lane 1510 as described herein. The iteration index circuit 1528 may generate a corresponding iteration index for the next lane 1512 by adding the lane width to the first lane iteration index. An iteration index for the lane 1514 may be generated by adding the lane width to the iteration index for the lane 1512, and so on. Index interfaces for all of the lanes 1510, 1512, 1514, 1516 may be generated and packed into a single packed iteration index. The packed iteration index, in some examples, has a width equal to the combine data width of the parallel processing lanes 1510, 1512, 1514. For example, the packed iteration interface may be provided to the respective lanes 1510, 1512, 1514, 1516 in parallel as shown. Each lane 1510, 1512, 1514, 1516 may use its lane-specific iteration index to execute I/O operations to the compute element memory 1506 and/or to external memory, as described herein.

Figure 16:
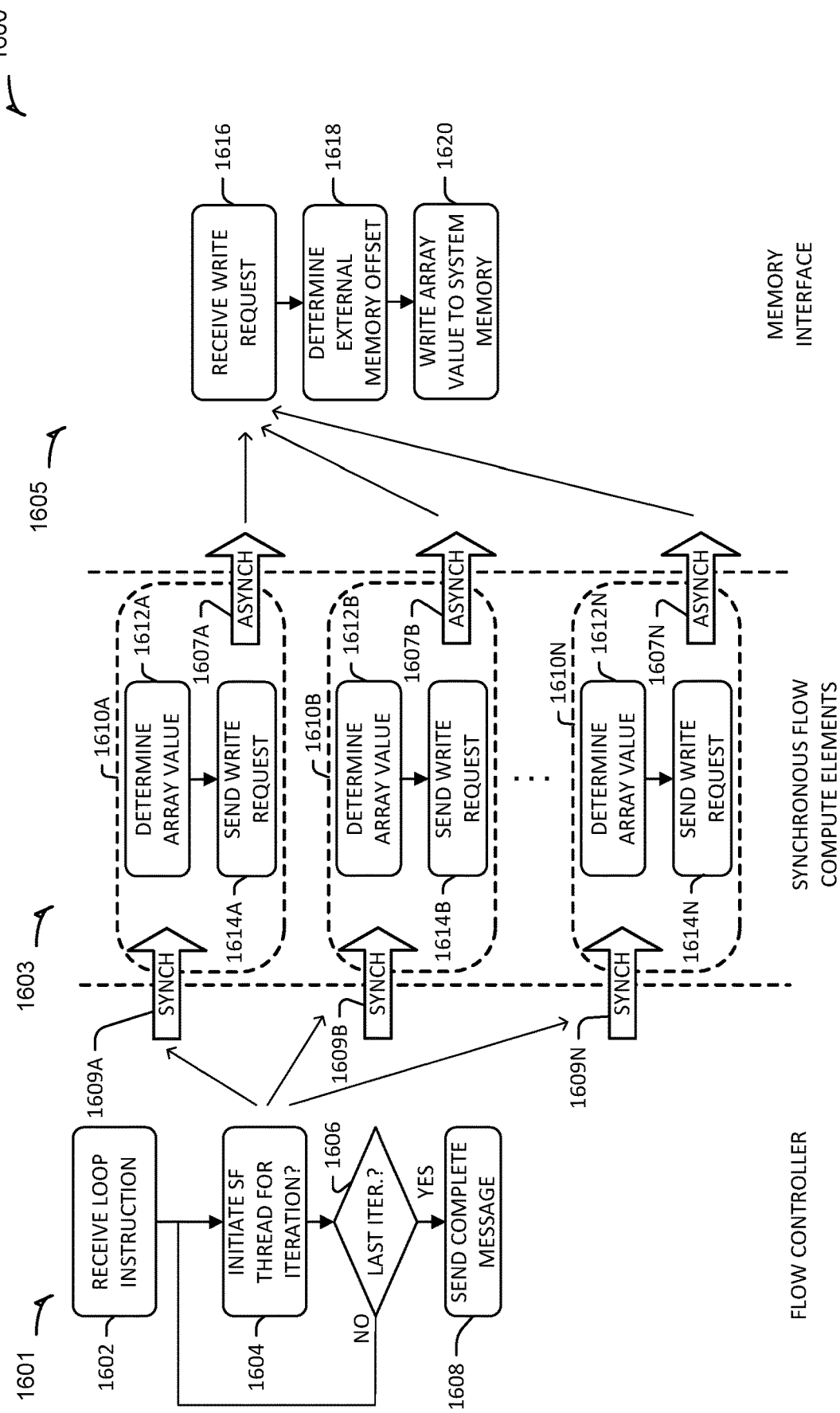
FIG. 16 is a flowchart showing one example of a process flow that may be executed using a synchronous flow and a memory interface to write values of a multi-dimensional array to external memory.

FIG. 16 is a flowchart showing one example of a process flow 1600 that may be executed using a synchronous flow and a memory interface to write values of a multi-dimensional array to external memory. The process flow 1600 includes three columns 1601, 1603, 1605. The column 1601 includes operations executed by a flow controller of the synchronous flow. The column 1603 includes operations executed by the compute elements of the synchronous flow. The column 1605 includes operations executed by the memory interface. In the example of FIG. 16, the synchronous flow executes an inner loop of a set of two or more nested loops. For example, referring to the example code segment [3], the synchronous flow may be executing all or a portion of the inner "y" loop. Referring to the example of FIG. 12, the synchronous flow of FIG. 16 may execute all or a portion of the inner "z" loop, for example, similar to the synchronous flow 1207 of FIG. 12.

At operation 1602, the flow controller receives an instruction to begin executing a loop. The instruction may be, for example, an asynchronous loop message received from a dispatch interface, another flow controller, or other suitable component. The loop message may include an indication of the iteration count of the inner loop as well as an indication of the corresponding iteration numbers of the one or more outer loops. For example, if the process flow 1600 were used to execute the inner "x" loop of the example code segment [3], the loop message may indicate an iteration count of 2048 for the inner "x" loop and a corresponding iteration number of the iteration of the outer "y" loop that initiated the loop message. If the process flow 1600 were used to execute the inner "z" loop of the example of FIG. 12, the loop message may indicate an iteration count of N for the inner "z" loop as well as a corresponding iteration number of the iteration of the outer "y" loop that initiated the loop message and a corresponding iteration count of the other "x" loop that initiated the iteration of the "y" loop.

At operation 1604, the flow controller initiates a first synchronous flow thread 1610A to execute an iteration of the inner loop. To initiate the synchronous flow thread 1610A, the flow controller sends a synchronous message 1609A to a first compute element of the synchronous flow compute elements. The synchronous message 1609A may include an indication of the inner loop iteration to be executed by the synchronous flow thread and an indication of the iteration numbers of the one or more corresponding outer loops. In some examples, the indications of the iteration numbers included with the synchronous message 1609A is or includes an iteration index, as described herein.

At operation 1606, the flow controller determines if the iteration initiated at operation 1604 is the last iteration of the inner loop. If it is, then the flow controller sends an asynchronous complete message at operation 1608. The asynchronous complete message may be sent, for example, to a dispatch interface and/or to a flow controller of another synchronous flow, as described herein.

If at operation 1606, the flow controller determines that there are iterations yet to be initiated, the flow controller returns to operation 1604 and initiates another thread 1610B to execute a next iteration of the inner loop by sending an additional synchronous message 1609B to the first compute element of the synchronous flow compute elements. The synchronous message 1609B may be sent, for example, at the appropriate spoke count so as to avoid interfering with the previous synchronous flow thread 1610A. In some examples, the flow controller initiates a new synchronous flow thread at operation 1604 only when an additional thread ID is available.

Referring now to the synchronous flow threads 1610A, 1610B, 1610N, the compute elements of the synchronous flow receive the messages 1609A, 1609B, 1609N. At operations 1608A, 1608B, 1608N, the synchronous flow compute elements determine one or more array values for the multi-dimensional array, for example, as described herein. At operations 1614A, 1614B, 1614N, the compute elements of the synchronous flow send respective asynchronous write requests 1607A, 1607B, 1607N to the memory interface. Each respective write request 1607A, 1607B, 1607N includes payload data indicating the array value or values generated by the sending synchronous flow thread as well as indications of the iteration number of the inner loop and the iteration number or numbers of one or more outer loops. In some examples, the write requests 1607A, 1607B, 1607N include an iteration index that indicates iteration numbers for all relevant loops, for example, similar to the write request 1336 described with respect to FIG. 13.

The memory interface may perform operations 1616, 1618, and 1620 upon receiving each of the write requests 1607A, 1607B, 1607N. At operation 1616, the memory interface receives a write request. At operation 1618, the memory interface determines an external memory offset associated with the iteration numbers indicated by the write request 1607A, 1607B, 1607N. The external memory offset indicates an external memory location where the value or values of the array indicated by the payload data are to be written. For example, the memory interface may add the external memory offset to a base external memory location to determine a location for writing the payload data. As described in more detail herein, the offset may map between the multi-dimensional array and a set of external memory locations.

At operation 1618, the memory array writes the payload data to the external memory at an external memory location or locations indicated by the external memory offset determined at operation 1616. For example, the memory interface may add the external memory offset to a base external memory location and write the payload data to the corresponding address.

Figure 17:
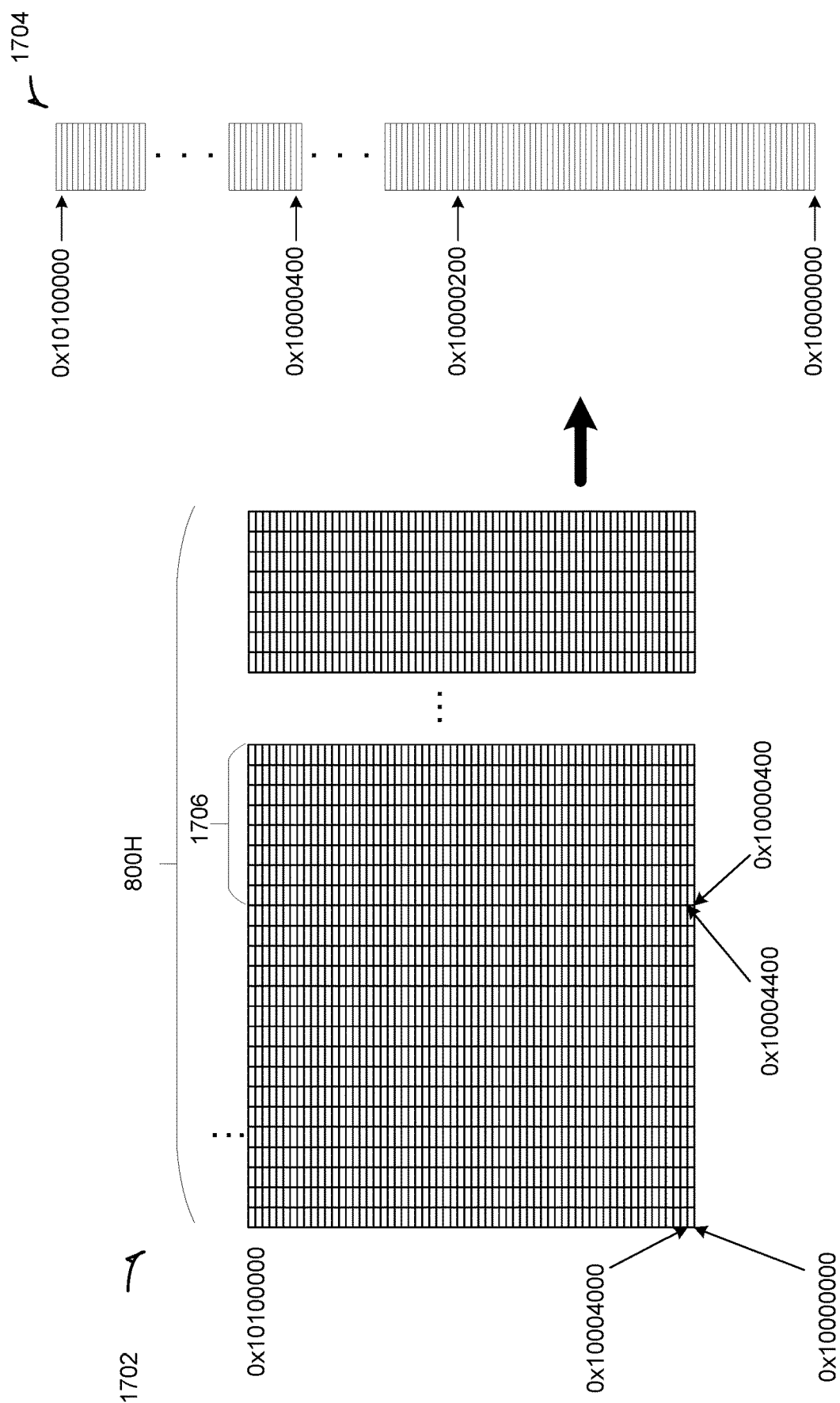
FIG. 17 is a diagram showing one example of a multi-dimensional array mapped to external memory locations using an external memory offset.

FIG. 17 is a diagram showing one example of a multi-dimensional array 1702 mapped to external memory locations 1704 using an external memory offset. The arrangement of FIG. 17 illustrates one way that a memory interface can determine an external memory offset from the iteration numbers included with a write request, such as the write requests 1607A, 1607B, 1607N. In the example of FIG. 17, the multi-dimensional array 1702 is a two dimensional array having dimensions of 2048×2048 or 800H×800H. For example, the multidimensional array may be generated using a set of two nested loops, an outer loop having an iteration count of 2048 and an inner loop also having an iteration count of 2048. For each iteration of the outer loop, the inner loop generates 2048 array values leading to a total of 2048×2048 or 4,194,304 array values.

The memory interface determines the external memory offset to transform the array 1702 to a set of linear external memory locations relative to a base external memory location. In FIG. 17, external memory locations 1704 begin at an example base external memory address 0x10000000 and increase from top to bottom. In the example of FIG. 17, external memory addresses are expressed in hexadecimal.

As described herein, each value of the array 1702 is stored to the external memory locations 1704 offset from the base external memory address by a value corresponding to the loop iterations that generated the values. FIG. 17 illustrates an example where this is accomplished row-by-row. That is, the bottom row of the array 1702 is written starting at the base external memory address 0x10000000, then the next to the bottom row of the array 1702 is written, and so on. The techniques described herein, however, could also be applied to write the array 1702 column-by-column.

The memory interface uses the inner loop number and outer loop number to generate the external memory offset for a given array value. The row and column values of each value of the array 1702 may be characterized by the iteration numbers of the outer and inner loop iterations that generated the value. For example, array value [0,0] may be generated by the first iteration of the outer loop and the corresponding first iteration of the inner loop. The array value [137, 820] may be generated by the 138$^{th}$ iteration of the outer loop and the corresponding 820$^{th}$ iteration of the inner loop.

The memory interface may generate the external memory offset for an array value using a combination of an outer loop offset and an inner loop offset. In some examples, the outer loop offset may be generalized by equation [5] below:

$$oloop\_offset=(oloop\_iternum*(data\_width*oloop\_dim)) \quad [5]$$

In [5], oloop_offset is the outer loop offset. oloop_iternum is the iteration number of the outer loop. data_width is the number of external memory locations used to store each value of the array 1702. For example, if the external memory has one-byte memory locations, then the data_width is the number of bytes in the array values. Also, oloop_dim is the dimension of the multi-dimensional array corresponding to the outer loop. In the example of FIG. 17, the outer loop dimension of the multi-dimensional array is 2048 and the data width is eight bytes. Accordingly, the outer loop offset for array values in the first row is zero, the outer loop offset for array values in the second row is 16,384 (4000H). In some examples, the inner loop offset may be generalized by equation [6]:

$$iloop\_offset=(iloop\_iternum*data\ width) \quad [6]$$

In equation [6], iloop_offset is the inner loop offset and Iloop_iternum is the iteration number of the inner loop. The total external memory offset, in some examples, is a sum of the inner loop offset and the outer loop offset, given by equation [7] below:

$$eMemOffset=oloop\_offset+iloop\_offset \quad [7]$$

Consider now the example of FIG. 17, where the base external memory location address is 0x10000000 and the data width is eight (e.g., each array value takes up eight one-byte external memory locations). For the array value [0,0], the outer loop offset and inner loop offset would be zero, for a total loop offset of zero. Accordingly, the memory interface may write the array value [0,0] to the base external memory address 0x10000000.

For the value [0,1] of the array 1702, the outer loop offset is still zero while the inner loop offset is eight, so the external memory offset is eight. Accordingly, the array value [0,1] may be stored beginning at an external memory location 0x10000008, which is offset from the base external memory address 0x10000000 by eight. For the value [0,2] of the array 1702, the outer loop offset is still zero while the inner loop offset is 16. Accordingly, the array value [0,2] is written to the external memory location 0x10000010, which is offset from the base external memory address 0x10000000 by sixteen bytes (recall that the external memory location addresses are expressed in hexadecimal).

This pattern continues through the row [0,i] of the array, with the outer loop offset being zero and the inner loop offset being based on the inner loop iteration number. The last iteration of the inner loop corresponding to the first iteration 0 of the outer loop generates the array value [0,2047], which is the last value of the first row. For the array value [0,2047], the outer loop offset remains zero while the inner loop offset is 2047 times 8, or 16,376 (3FF8H). Accordingly, the memory interface may store the array value [0,2047] beginning at the external memory location 0x10003FF8, which is offset by the base external memory address by 16,376 or 3FF8H.

Consider also the first column value for the second row of the array 1702 (value [1,0]). For this array value, the outer loop offset is now 16,384 (4000H). The inner loop offset is zero, so the total offset is 16,384 (4000H). Accordingly, the memory interface writes the array 7102 value [1,0] beginning at external memory location address 0x1004000 as shown in FIG. 17. The memory interface may similarly find external memory offsets for the other values of the array 1702 as illustrated.

In some examples, the array values for a multi-dimensional array can be determined by synchronous flows having compute elements with multiple parallel processing lanes. In these arrangements, each synchronous flow thread may execute multiple iterations of an inner loop in parallel. Accordingly, the payload data generated by each synchronous flow includes multiple values for the array 1702.

Consider an example in which the compute elements of the synchronous flow include eight parallel processing lanes, with each parallel processing lane generating an eight-byte array value. Accordingly, each synchronous flow thread may evaluate eight iterations of the inner loop simultaneously. The payload data generated by each thread may include the eight array values generated for the eight iterations, with each array value comprising eight bytes. Accordingly, the payload data from a first synchronous flow thread may include the [0,0], [0,1], [0,2], [0,3], [0,4], [0,5], [0,6], and [0,7] values for the array 1702. The payload data generated by a next synchronous flow thread may include the [0,8], [0,9], [0,10], [0,11], [0,12], [0,13], [0,14], and [0,15] for the array 1702, and so on. Accordingly, executing 2048 iterations of the inner loop to generate a row of values for the array 1702 may only involve executing 256 synchronous flow threads.

In examples where the synchronous flow compute elements comprise multiple parallel processing lanes, the memory interface may take this into account by considering the thread number and the number of parallel processing lanes when finding the inner loop offset. An example is given by equation [7] below:

$$iloop\_offset = (iloop\_threadnum * data\_width * ppl\_num) \quad [7]$$

In equation [7], iloop_threadnum is the thread number of the synchronous flow thread. For example, the thread returning array values [i,0], [i,1], [i,2], [i,3], [i,4], [i,5], [i,6], and [i,7] would be thread 0, the thread returning array values [i,8], [i,9], [i,10], [i,11], [i,12], [i,13], [i,14], and [i,15] would be thread 1, and so on. ppl_num is the number of parallel processing lanes in the compute elements. When parallel processing lanes are used, the memory interface may use equation [7] to generate the inner loop offset while using equation [5] to generate the one or more outer loop offsets.

In some examples, the external memory offset described herein can be used in arrangements where different synchronous flows are used to generate different values of a multi-dimensional array. Different synchronous flows, for example, may generate external memory offsets, as described herein, and apply the offsets to different base locations. Referring again to the example of FIG. 17, consider the 64 columns of the array 1702 indicated by 1706. The 64 columns 1706 correspond to column numbers 129-191. A single synchronous flow may execute sixty-four iterations of the inner loop corresponding to columns 129-191, using the inner and outer loop offsets described herein and using 0x10000400 as the base external memory locations. Other synchronous flows may similarly find array values for different columns of the array 1702 using other suitable base external memory locations.

It will be appreciated that although FIG. 17 shows a two-dimensional array, the described technique can, in some examples, be used for arrays having additional dimensions. Consider, for example, a set of three nested loops for generating an a×b×c array. A first level loop would execute a times. A second level loop would execute b times, and a third-level or inner loop would execute c times. In this example, the memory interface would find an external memory offset for each iteration of the inner loop by summing an outer loop offset for the first-level loop, an outer loop offset for the second-level loop and an inner loop offset for the third level or inner loop. In this example, the outer loop dimension for the first-level loop would be a and the outer loop dimension for the second-level loop would be b. Additional dimensions of the output array can be added, for example, by adding additional outer loop offsets as illustrated.

In some examples, a write request generated by a synchronous flow thread may indicate the inner and outer loop iteration numbers using an iteration index, as described herein. In these examples, the memory interface may be configured to convert an iteration index to an inner loop portion indicating the inner loop iteration number and an outer loop portion indicating the outer loop iteration number. For example, this may be accomplished by masking and (if necessary) division (or bit shifting). Consider an example eight-bit iteration index where the outer loop iteration number is indicated by the four most-significant bits and the inner loop iteration number is indicated by the four least-significant bits. To find the inner loop offset, the memory interface may apply an inner loop mask that masks the four most-significant bits. To find the outer loop offset, the memory interface may apply an outer loop mask that masks the four least-significant bits and shift the remaining bits right by four to yield the outer loop iteration number.

Consider another example implemented by a synchronous flow having compute elements with multiple parallel processing lanes, as described herein. Recall that in such an arrangement, the number of synchronous flow threads to execute the inner loop iterations is less than the number of inner loop iterations. Accordingly, the number of bits in the iteration index to indicate thread number may be less than the number of bits to indicate a full inner loop iteration number.

Figure 18:
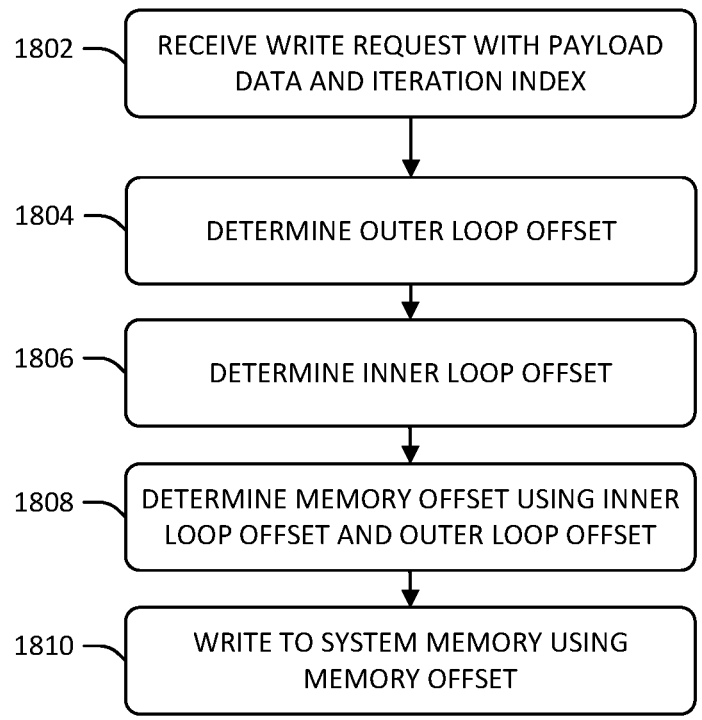
FIG. 18 is a flow chart showing one example of a process flow that can be executed by a memory interface to generate an external memory offset.

FIG. 18 is a flow chart showing one example of a process flow 1800 that can be executed by a memory interface to generate an external memory offset. For example, the process flow 1800 shows one example way that a memory interface can perform operation 1618 of the process flow 1600. At operation 1802, the memory interface receives a write request comprising payload data and an iteration index or other indication of the outer loop iteration number and inner loop iteration number.

At operation 1804, the memory interface determines an outer loop offset. In examples where an iteration index is used, the memory interface may apply appropriate masking and shifting of the iteration index to yield the outer loop iteration number. The outer loop iteration number may then be used, as described herein, to generate the outer loop offset. If there is more than one outer loop, the memory interface may generate more than one outer loop offset, as described herein. At operation 1806, the memory interface determines an inner loop offset. In examples where the iteration index is used, the memory interface may apply appropriate masking and shifting of the iteration index to yield the inner loop iteration number and/or inner loop thread number. The inner loop iteration number and/or inner loop thread number may be used, as described herein, to generate the inner loop offset.

At operation 1808, the memory interface determines the external memory offset for the write request using the inner loop offset determined at operation 1806 and the one or more outer loop offsets determined at operation 1804. For example, the memory interface may sum the inner and one or more outer offsets. At operation 1810, the memory interface writes the payload data beginning at the external memory location indicated by the offset. For example, the memory interface may determine an address of the external memory location indicated by the offset by adding the offset to a base external memory location, as described herein.

Figure 19:
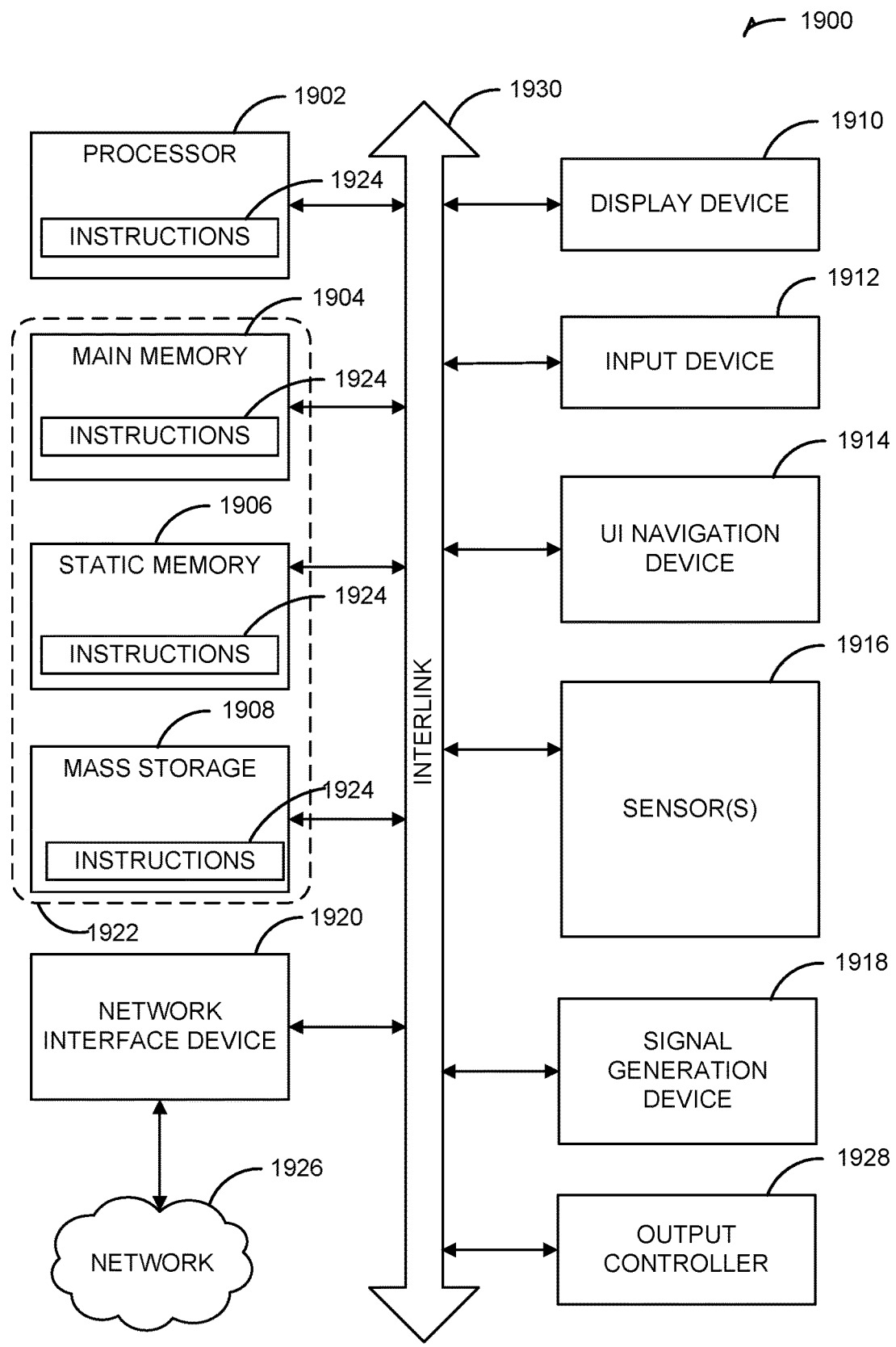
FIG. 19 illustrates a block diagram of an example machine with which, in which, or by which any one or more of the techniques (e.g., methodologies) discussed herein can be implemented.

FIG. 19 illustrates a block diagram of an example machine 1900 with which, in which, or by which any one or more of the techniques (e.g., methodologies) discussed herein can be implemented. Examples, as described herein, can include, or can operate by, logic or a number of components, or mechanisms in the machine 1900. Circuitry (e.g., processing circuitry) is a collection of circuits implemented in tangible entities of the machine 1900 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 1900.

In alternative embodiments, the machine 1900 can operate as a standalone device or can be connected (e.g., networked) to other machines. In a networked deployment, the machine 1900 can operate in the capacity of a server machine, a client machine, or both in server-client network environments. In an example, the machine 1900 can act as a peer machine in peer-to-peer (P2P) (or other distributed) network environment. The machine 1900 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1900 (e.g., computer system) can include a hardware processor 1902 (e.g., a central processing unit (CPU), a graphics processing unit (GPU), a hardware processor core, or any combination thereof), a main memory 1904, a static memory 1906 (e.g., memory or storage for firmware, microcode, a basic-input-output (BIOS), unified extensible firmware interface (UEFI), etc.), and mass storage device 1908 (e.g., hard drives, tape drives, flash storage, or other block devices) some or all of which can communicate with each other via an interlink 1930 (e.g., bus). The machine 1900 can further include a display device 1910, an alphanumeric input device 1912 (e.g., a keyboard), and a user interface (UI) Navigation device 1914 (e.g., a mouse). In an example, the display device 1910, the input device 1912, and the UI navigation device 1914 can be a touch screen display. The machine 1900 can additionally include a mass storage device 1908 (e.g., a drive unit), a signal generation device 1918 (e.g., a speaker), a network interface device 1920, and one or more sensor(s) 1916, such as a global positioning system (GPS) sensor, compass, accelerometer, or other sensor. The machine 1900 can include an output controller 1928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 1902, the main memory 1904, the static memory 1906, or the mass storage device 1908 can be, or include, a machine-readable media 1922 on which is stored one or more sets of data structures or instructions 1924 (e.g., software) embodying or used by any one or more of the techniques or functions described herein. The instructions 1924 can also reside, completely or at least partially, within any of registers of the hardware processor 1902, the main memory 1904, the static memory 1906, or the mass storage device 1908 during execution thereof by the machine 1900. In an example, one or any combination of the hardware processor 1902, the main memory 1904, the static memory 1906, or the mass storage device 1908 can constitute the machine-readable media 1922. While the machine-readable media 1922 is illustrated as a single medium, the term "machine-readable medium" can include a single medium or multiple media (e.g., a centralized or distributed database, or associated caches and servers) configured to store the one or more instructions 1924.

The term "machine readable medium" can include any medium that is capable of storing, encoding, or carrying instructions for execution by the machine 1900 and that cause the machine 1900 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices;

magnetic disks, such as internal hard disks and removable disks; magneto-optical disks; and CD-ROM and DVD-ROM disks.

In an example, information stored or otherwise provided on the machine-readable media 1922 can be representative of the instructions 1924, such as instructions 1924 themselves or a format from which the instructions 1924 can be derived. This format from which the instructions 1924 can be derived can include source code, encoded instructions (e.g., in compressed or encrypted form), packaged instructions (e.g., split into multiple packages), or the like. The information representative of the instructions 1924 in the machine-readable media 1922 can be processed by processing circuitry into the instructions to implement any of the operations discussed herein. For example, deriving the instructions 1924 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1924.

In an example, the derivation of the instructions 1924 can include assembly, compilation, or interpretation of the information (e.g., by the processing circuitry) to create the instructions 1924 from some intermediate or preprocessed format provided by the machine-readable media 1922. The information, when provided in multiple parts, can be combined, unpacked, and modified to create the instructions 1924. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1924 can be further transmitted or received over a communications network 1926 using a transmission medium via the network interface device 1920 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1920 can include one or more physical jacks (e.g., Ethernet, coaxial, or phone jacks) or one or more antennas to connect to the network 1926. In an example, the network interface device 1920 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1900, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a reconfigurable compute fabric comprising multiple compute elements and at least one flow controller, the reconfigurable compute fabric arranged to include a first synchronous flow comprising a flow controller of the at least one flow controller and a number of the multiple compute elements, the first synchronous flow programmed through use of stored instructions to perform operations comprising:

executing a first synchronous flow thread, the first synchronous flow thread for executing at least a portion of a loop iteration for generating at least one value of a multi-dimensional array;

sending, by a compute element of the first synchronous flow, a write request to a memory interface, the write request comprising an iteration index indicating the loop iteration and payload data comprising at least one value for the multi-dimensional array; and a memory interface, the memory interface programmed through use of stored instructions to perform operations comprising:

determining an external memory offset using the iteration index; and writing the payload data to an external memory at an external memory location indicated by the external memory offset.

2. The apparatus of claim 1, the loop iteration being an inner loop iteration associated with an outer loop iteration, the iteration index indicating the inner loop iteration and the outer loop iteration, the memory interface being further configured to perform operations comprising:

determining an outer loop offset; and determining an inner loop offset, the external memory offset being based at least in part on the outer loop offset and the inner loop offset.

3. The apparatus of claim 2, further comprising determining the outer loop offset using a first dimension of the multi-dimensional array and the iteration index.

4. The apparatus of claim 2, the memory interface being further configured to perform operations comprising:

applying an outer loop mask to the iteration index to generate an outer loop portion of the iteration index; and determining a product of the outer loop portion of the iteration index and a first dimension of the multi-dimensional array.

5. The apparatus of claim 4, the memory interface being further configured to perform operations comprising determining a product of the outer loop portion of the iteration index, a data width of the at least one value of the multi-dimensional array, and the first dimension of the multi-dimensional array, the outer loop offset being based on the product of the outer loop portion of the iteration index, the data width of the at least one value of the multi-dimensional array, and the first dimension of the multi-dimensional array.

6. The apparatus of claim 2, the memory interface being further configured to perform operations comprising determining the inner loop offset using a data width of the at least one value of the multi-dimensional array.

7. The apparatus of claim 2, the memory interface being further configured to perform operations comprising applying an inner loop mask to the iteration index to generate an inner loop portion of the iteration index, the inner loop offset being based at least in part on the inner loop portion of the iteration index.

8. The apparatus of claim 7, the compute element comprising a number of parallel processing lanes, and the payload data comprising the at least one value of the multi-dimensional array, the memory interface being further configured to perform operations comprising:

determining a product of the inner loop portion of the iteration index, the number of parallel processing lanes, and a data width of the at least one value of the multi-dimensional array.

9. A method comprising:

executing a first synchronous flow thread by a first synchronous flow of a reconfigurable compute fabric, the first synchronous flow thread for executing at least a portion of a loop iteration for generating at least one value of a multi-dimensional array, the reconfigurable compute fabric comprising multiple compute elements and a flow controller, the reconfigurable compute fabric being arranged to include the first synchronous flow, the first synchronous flow comprising the flow controller and a number of the multiple compute elements of the reconfigurable compute fabric;

sending, by a compute element of the first synchronous flow, a write request to a memory interface, the write request comprising an iteration index indicating the loop iteration and payload data comprising at least one value for the multi-dimensional array;

determining, by the memory interface, an external memory offset using the iteration index; and writing, by the memory interface, the payload data to an external memory at an external memory location indicated by the external memory offset.

10. The method of claim 9, the loop iteration being an inner loop iteration associated with an outer loop iteration, the iteration index indicating the inner loop iteration and the outer loop iteration, further comprising:

determining an outer loop offset; and determining an inner loop offset, the external memory offset being based at least in part on the outer loop offset and the inner loop offset.

11. The method of claim 10, further comprising determining the outer loop offset using a first dimension of the multi-dimensional array and the iteration index.

12. The method of claim 10, further comprising:

applying an outer loop mask to the iteration index to generate an outer loop portion of the iteration index; and determining a product of the outer loop portion of the iteration index and a first dimension of the multi-dimensional array.

13. The method of claim 12, the method further comprising determining a product of the outer loop portion of the iteration index, a data width of the at least one value of the multi-dimensional array, and the first dimension of the multi-dimensional array, the outer loop offset being based on the product of the outer loop portion of the iteration index, the data width of the at least one value of the multi-dimensional array, and the first dimension of the multi-dimensional array.

14. The method of claim 10, further comprising determining the inner loop offset using a data width of the at least one value of the multi-dimensional array.

15. The method of claim 10, further comprising applying an inner loop mask to the iteration index to generate an inner loop portion of the iteration index, the inner loop offset being based at least in part on the inner loop portion of the iteration index.

16. The method of claim 15, the compute element comprising a number of parallel processing lanes, and the payload data comprising the at least one value of the multi-dimensional array, the method further comprising:

determining a product of the inner loop portion of the iteration index, the number of parallel processing lanes, and a data width of the at least one value of the multi-dimensional array.

17. A non-transitory machine readable medium comprising instructions thereon that, when executed by a processor, cause the processor to perform operations comprising:
- executing a first synchronous flow thread by a first synchronous flow, the first synchronous flow thread for executing at least a portion of a loop iteration for generating at least one value of a multi-dimensional array;
- sending, by a compute element of the first synchronous flow, a write request to a memory interface, the write request comprising an iteration index indicating the loop iteration and payload data comprising at least one value for the multi-dimensional array;
- determining, by the memory interface, an external memory offset using the iteration index; and
- writing, by the memory interface, the payload data to an external memory at an external memory location indicated by the external memory offset.

18. The medium of claim 17, the loop iteration being an inner loop iteration associated with an outer loop iteration, the iteration index indicating the inner loop iteration and the outer loop iteration, the operations further comprising:
- determining an outer loop offset; and
- determining an inner loop offset, the external memory offset being based at least in part on the outer loop offset and the inner loop offset.

19. The medium of claim 18, the operations further comprising determining the outer loop offset using a first dimension of the multi-dimensional array and the iteration index.

20. The medium of claim 18, the operations further comprising:
- applying an outer loop mask to the iteration index to generate an outer loop portion of the iteration index; and
- determining a product of the outer loop portion of the iteration index and a first dimension of the multi-dimensional array.

* * * * *